(12) United States Patent
Wu et al.

(10) Patent No.: US 12,167,561 B2
(45) Date of Patent: Dec. 10, 2024

(54) TOOLLESS PANEL MOUNTING SYSTEM

(71) Applicant: COMMSCOPE TECHNOLOGIES LLC, Hickory, NC (US)

(72) Inventors: Wenyong Wu, Jiangsu (CN); Jing Wang, Jiangsu (CN); Yu Zhao, Jiangsu (CN); Zhihui Liu, Jiangsu (CN); Danny Ghislain Thijs, Zonhoven (BE)

(73) Assignee: COMMSCOPE TECHNOLOGIES LLC, Hickory, NC (US)

(*) Notice: Subject to any disclaimer, the term of this patent is extended or adjusted under 35 U.S.C. 154(b) by 472 days.

(21) Appl. No.: 17/437,355

(22) PCT Filed: Mar. 6, 2020

(86) PCT No.: PCT/US2020/021365
§ 371 (c)(1),
(2) Date: Sep. 8, 2021

(87) PCT Pub. No.: WO2020/185550
PCT Pub. Date: Sep. 17, 2020

(65) Prior Publication Data
US 2022/0174835 A1    Jun. 2, 2022

(30) Foreign Application Priority Data

Mar. 8, 2019    (CN) .......................... 201910173609.1
Mar. 8, 2019    (CN) .......................... 201920299990.1
(Continued)

(51) Int. Cl.
*H05K 7/14*    (2006.01)
*H04Q 1/02*    (2006.01)
*H05K 7/18*    (2006.01)

(52) U.S. Cl.
CPC ............ *H05K 7/1417* (2013.01); *H04Q 1/13* (2013.01); *H05K 7/186* (2013.01)

(58) Field of Classification Search
CPC ......... H05K 7/1417; H05K 7/186; H04Q 1/13
See application file for complete search history.

(56) References Cited

U.S. PATENT DOCUMENTS 3,727,138 A    4/1973   Traub et al.
6,384,327 B1   5/2002   Bellanger
(Continued)

FOREIGN PATENT DOCUMENTS

CN    204291706 U    4/2015
CN    207380296 U    5/2018
(Continued)

OTHER PUBLICATIONS

International Search Report and Written Opinion of the International Searching Authority for International Patent Application No. PCT/US2020/021365 mailed Jul. 2, 2020, 13 pages.
(Continued)

*Primary Examiner* — Stanton L Krycinski
(74) *Attorney, Agent, or Firm* — Merchant & Gould P.C.

(57) ABSTRACT

A system and method that facilitates toolfree installation and removal of a patch panel in telecommunications cabinets. The system and method involves a simple and quick installation and removal. The system and method includes a mounting clip member that can be used on either side of the panel.

16 Claims, 19 Drawing Sheets

(30) Foreign Application Priority Data

Aug. 30, 2019 (CN) .......................... 201910814851.2
Aug. 30, 2019 (CN) .......................... 201921442641.7

(56) References Cited

U.S. PATENT DOCUMENTS

| | | | |
|---|---|---|---|
| 6,568,542 B1 * | 5/2003 | Chen | H04Q 1/13 |
| | | | 361/826 |
| 6,695,149 B1 * | 2/2004 | Cote | H05K 7/183 |
| | | | 403/397 |
| 6,840,388 B2 | 1/2005 | Mayer | |
| 6,866,154 B2 | 3/2005 | Hartman et al. | |
| 6,891,727 B2 | 5/2005 | Dittas | |
| 6,926,378 B2 * | 8/2005 | Greenwald | A47B 88/43 |
| | | | 312/334.4 |
| 6,967,279 B2 * | 11/2005 | Cerniglia | H05K 9/0062 |
| | | | 174/138 R |
| 7,168,576 B2 | 1/2007 | Williams | |
| 7,371,109 B2 * | 5/2008 | Verding | H04Q 1/13 |
| | | | 439/532 |
| 7,404,736 B2 * | 7/2008 | Herbst | H04Q 1/13 |
| | | | 439/557 |
| 7,506,768 B2 * | 3/2009 | Rassmussen | H05K 7/1425 |
| | | | 211/183 |
| 7,731,142 B2 * | 6/2010 | Chen | A47B 88/43 |
| | | | 248/244 |
| 7,857,145 B2 * | 12/2010 | Mushan | A47B 88/43 |
| | | | 211/26 |
| 7,881,074 B2 * | 2/2011 | Lakoduk | H05K 7/1425 |
| | | | 361/810 |
| 7,930,812 B2 | 4/2011 | Curnalia et al. | |
| 7,959,015 B2 * | 6/2011 | Sempliner | H05K 7/1461 |
| | | | 211/26 |
| 8,602,225 B2 * | 12/2013 | Lin | A47B 88/43 |
| | | | 312/334.4 |
| 8,807,351 B2 * | 8/2014 | Lin | A47B 88/43 |
| | | | 312/334.4 |
| 8,955,693 B2 * | 2/2015 | Larsen | H02G 3/0418 |
| | | | 211/26 |
| 8,967,567 B2 * | 3/2015 | Chen | H05K 7/1489 |
| | | | 312/334.4 |
| 9,091,831 B2 * | 7/2015 | Chatellard | H04Q 1/13 |
| 9,363,922 B2 | 6/2016 | Larsen et al. | |
| 9,521,776 B1 * | 12/2016 | Brennan | H05K 7/18 |
| 9,658,655 B2 * | 5/2017 | Yu | G06F 1/181 |
| 10,051,758 B2 * | 8/2018 | Hofmann | H05K 7/1489 |
| 10,485,133 B1 * | 11/2019 | Revol | H05K 7/186 |
| 11,477,545 B2 * | 10/2022 | Liu | H04Q 1/13 |
| 2002/0153338 A1 * | 10/2002 | Orr | A47B 47/03 |
| | | | 211/183 |
| 2004/0079712 A1 | 4/2004 | Mayer | |
| 2004/0159618 A1 | 8/2004 | Nguyen et al. | |
| 2008/0217274 A1 | 9/2008 | Curnalia et al. | |
| 2010/0200523 A1 | 8/2010 | Henderson | |
| 2013/0109288 A1 * | 5/2013 | Tang | H05K 7/20172 |
| | | | 416/244 R |
| 2016/0205812 A1 * | 7/2016 | Curtin | H05K 7/20736 |
| | | | 361/679.46 |
| 2017/0118862 A1 | 4/2017 | Eberle, Jr. et al. | |
| 2018/0343762 A1 | 11/2018 | Palumbo | |

FOREIGN PATENT DOCUMENTS

| | | |
|---|---|---|
| CN | 207380297 U | 5/2018 |
| CN | 106300159 B | 10/2018 |
| EP | 2 341 589 B1 | 5/2012 |
| EP | 2 320 532 B1 | 11/2012 |
| EP | 2 369 699 B1 | 12/2014 |
| EP | 2 369 698 B1 | 3/2015 |
| EP | 3 351 010 B1 | 6/2019 |
| KR | 20-0463961 Y1 | 12/2012 |
| WO | 2014/173896 A1 | 10/2014 |

OTHER PUBLICATIONS

"LCS 3: 3 Dimensions of Excellence", Legrand, 72 pages (Jun. 2017).

"LCS 3: 3 Dimensions of Excellence", Legrand, 14 pages (Jun. 2017).

* cited by examiner

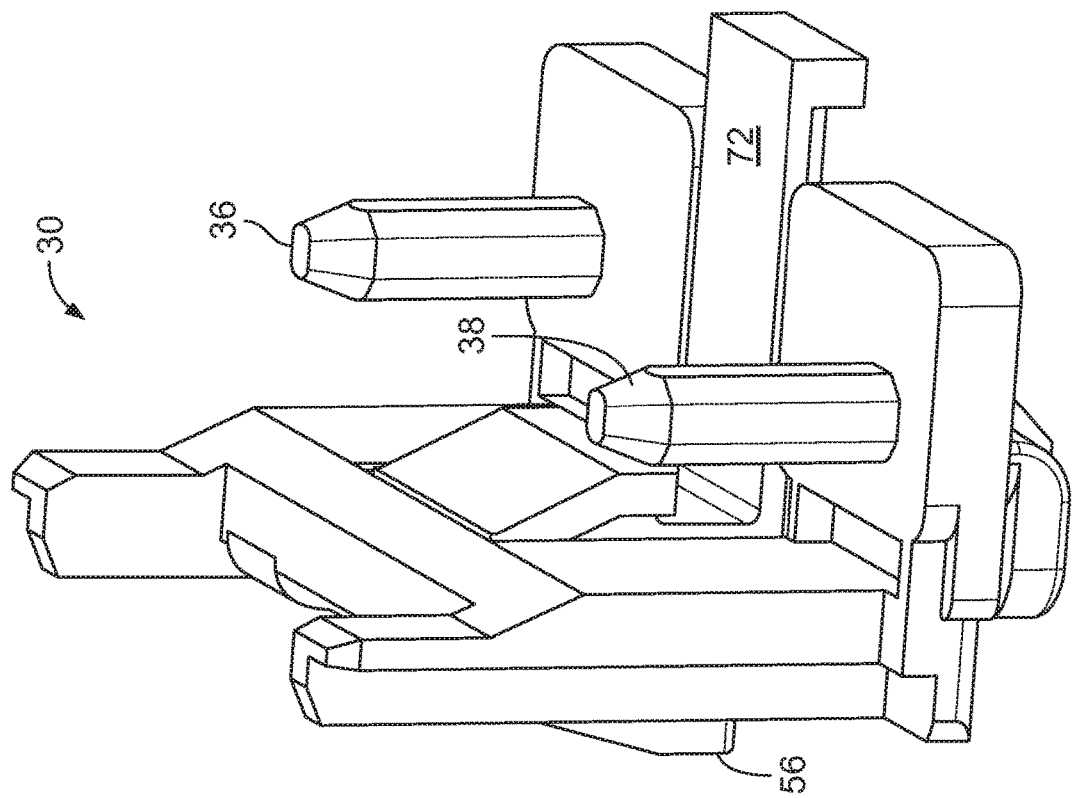
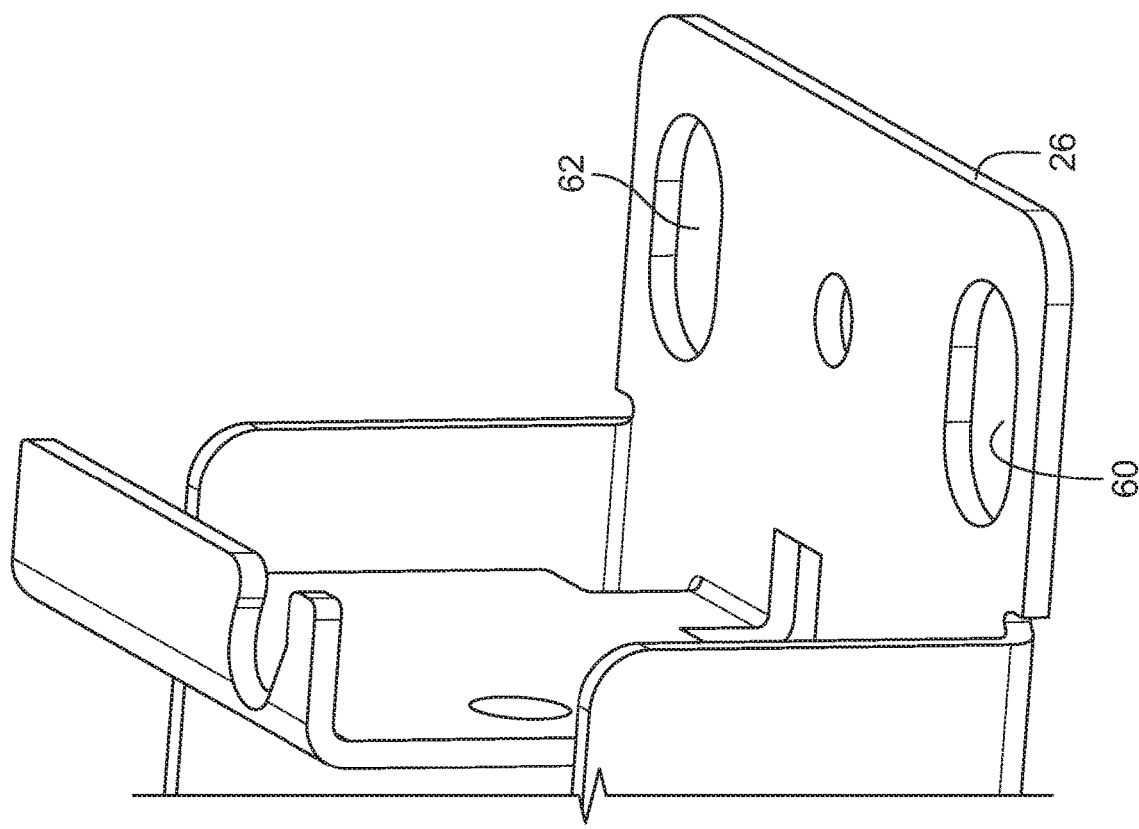
FIG. 6

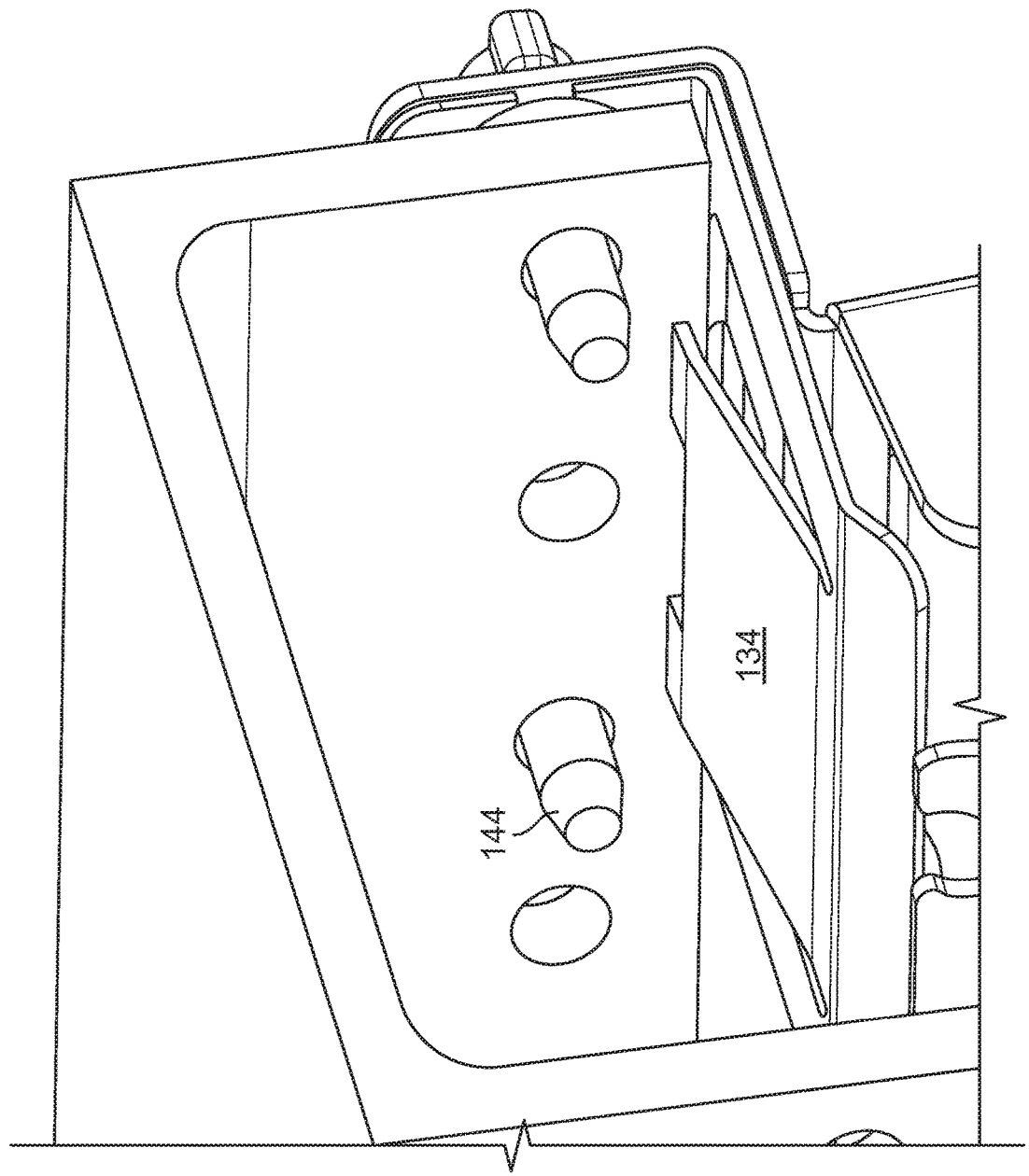

TOOLLESS PANEL MOUNTING SYSTEM

CROSS-REFERENCE TO RELATED APPLICATIONS

This application is a National Stage Application of PCT/US2020/021365, filed on Mar. 6, 2020, which claims the benefit of Chinese Patent Application No. 201910173609.1, filed on Mar. 8, 2019, and claims the benefit of Chinese Patent Application No. 201920299990.1, filed on Mar. 8, 2019, and claims the benefit of Chinese Patent Application No. 201910814851.2, filed on Aug. 30, 2019, and claims the benefit of Chinese Patent Application No. 201921442641.7, filed on Aug. 30, 2019, the disclosures of which are incorporated herein by reference in their entireties. To the extent appropriate, a claim of priority is made to each of the above disclosed applications.

TECHNICAL FIELD

A system and method of connecting telecommunications panels to a telecommunications rack.

BACKGROUND

Traditionally, telecommunications panels are mounted to telecommunications racks of frames and cabinets with fasteners. The fasteners extend through apertures in the end flanges of the panel and apertures in the spaced apart vertical rails. This system and method of attaching panels to the rails of the racks takes significant effort and time. It is desirable to develop new systems and methods that would facilitate easier and quicker mounting of panels to the telecommunications racks.

SUMMARY

The present disclosure provides a system and method that facilitates toolfree installation and removal of a telecommunications panel to a telecommunications rack. In one embodiment, the installation and removal involves simple and quick actions done by hand. In another embodiment, the system and method includes mounting clip members. The mounting clips interface between the panel and the rack to provide a secure engagement between the panel and rack without the need to tighten the panel to the rack with screws or bolts. In yet another embodiment, the mounting clips can be used to mount panels to racks with rail members having apertures of different sizes and shapes. In one example, toolless mounting features can be incorporated into the clips that are mounted to existing panels to allow such existing panels to be retrofitted to a toolless connection system. In another example, toolless mounting features can be integrated directly with the flanges of a panel thereby eliminating the need for separate clips.

BRIEF DESCRIPTION OF THE FIGURES

FIG. 6 is a rear isometric view of the mounting clip and panel of FIG. 1 in a disengaged position;

FIG. 26 is a rear isometric view of the mounting clip and panel secured to a rail;

DETAILED DESCRIPTION

Figure 1:
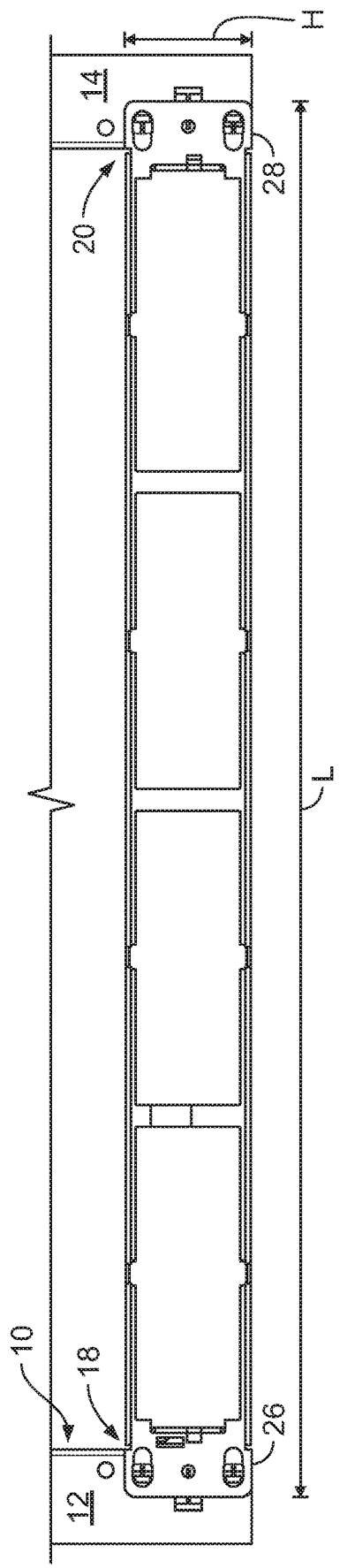
FIG. 1 is a front view of a panel mounted to a rack with a mounting clip according to an embodiment of the present disclosure.
Figure 2:
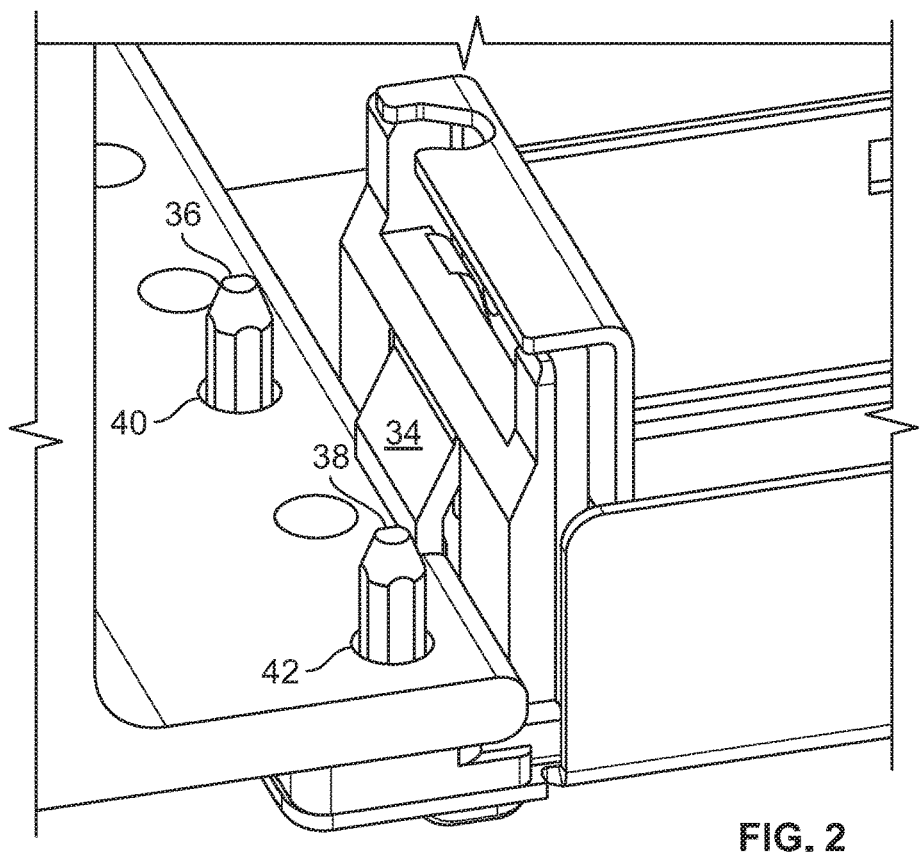
FIG. 2 is a rear isometric view of the mounting clip of the present disclosure engaged with the rack and panel.
Figure 3:
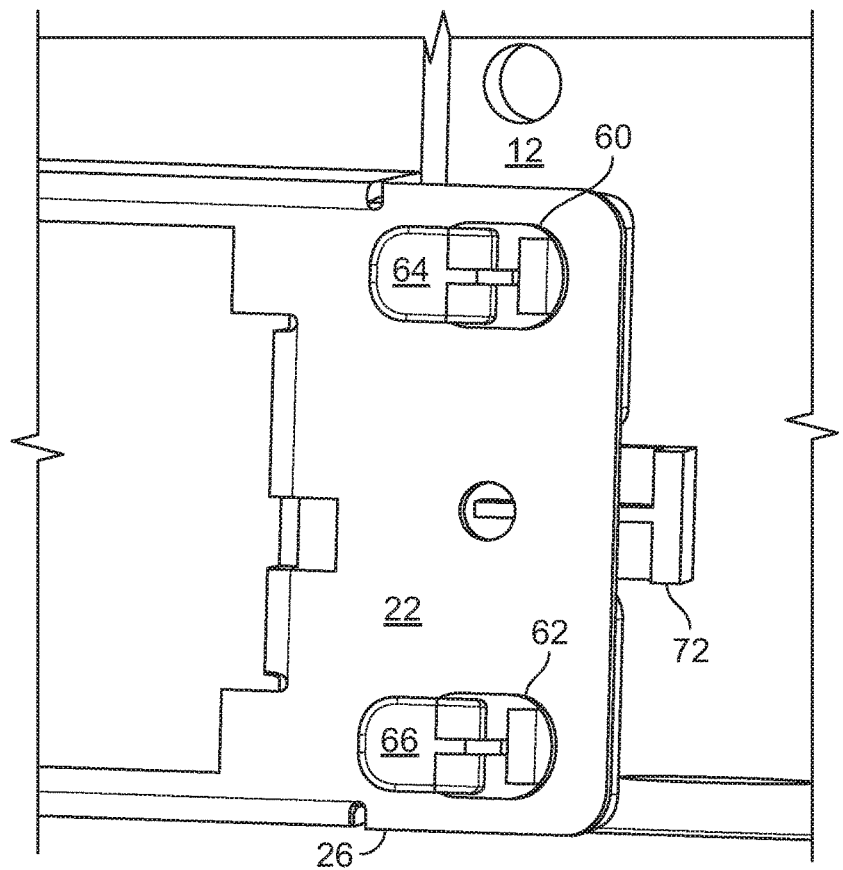
FIG. 3 is a front isometric view of the mounting clip of the present disclosure engaged with the rack and panel.
Figure 4:
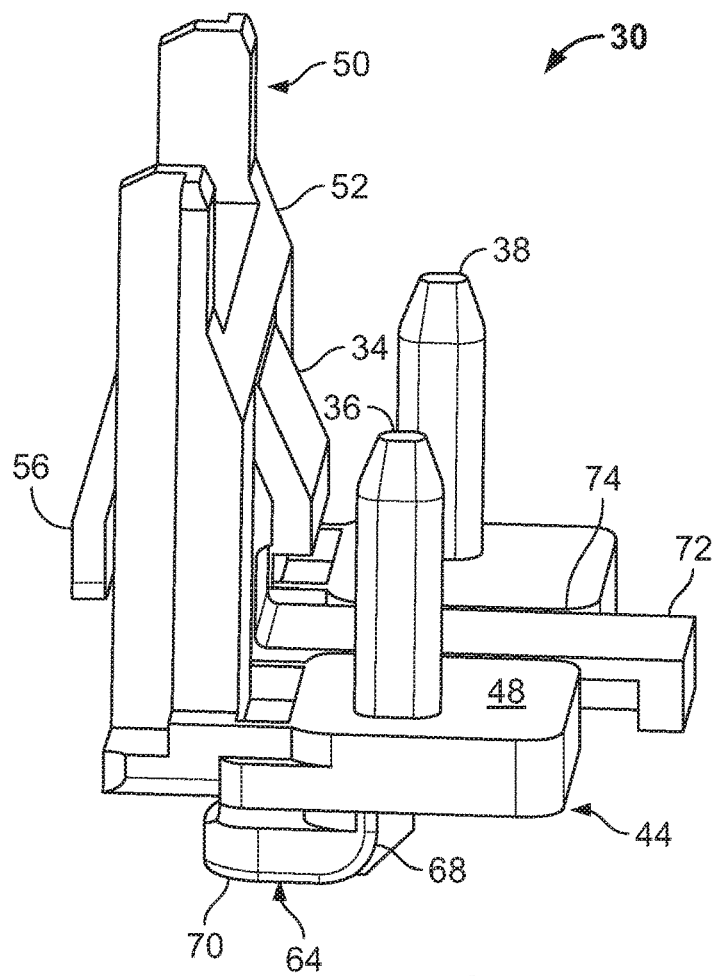
FIG. 4 is an isometric view of the mounting clip of FIG. 1.
Figure 5:
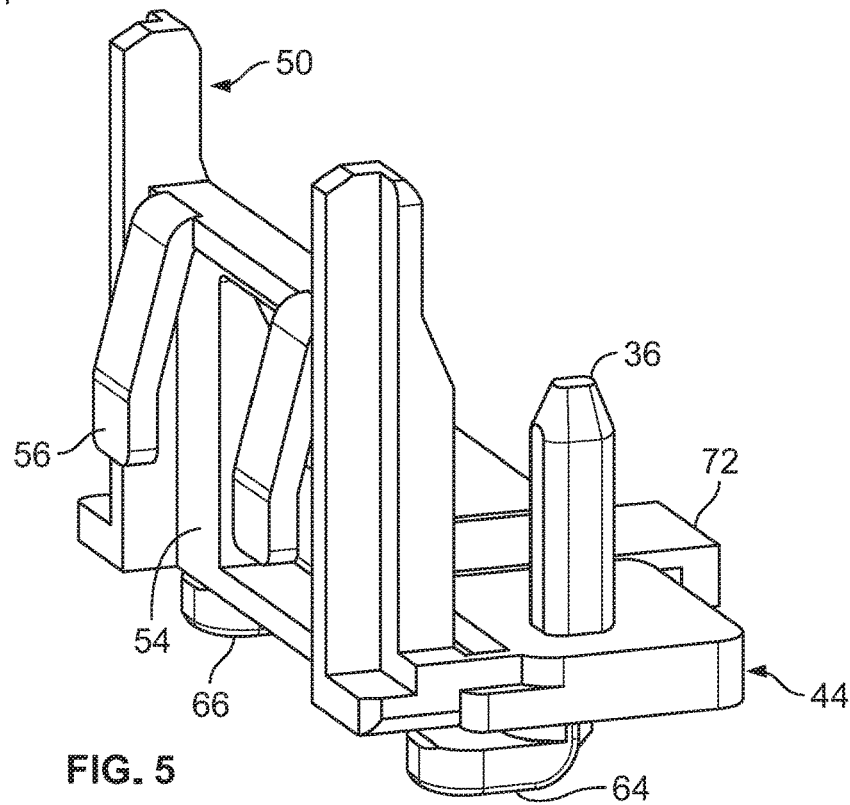
FIG. 5 is an isometric view of the mounting clip of FIG. 1.
Figure 7:
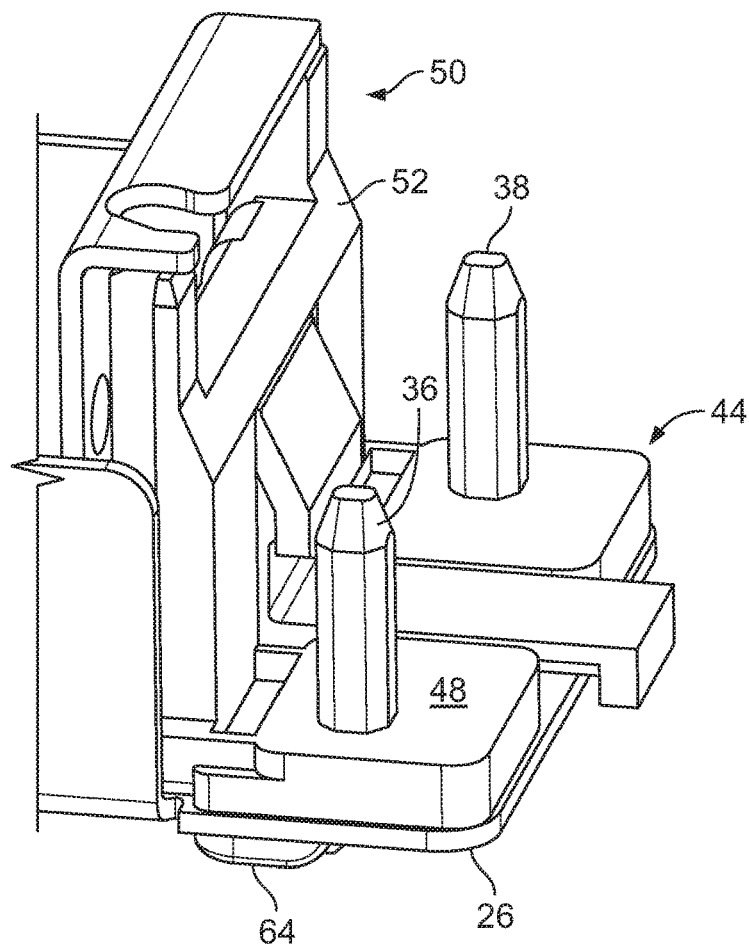
FIG. 7 is a rear isometric view of the mounting clip and panel of FIG. 1 in an engaged position.
Figure 8:
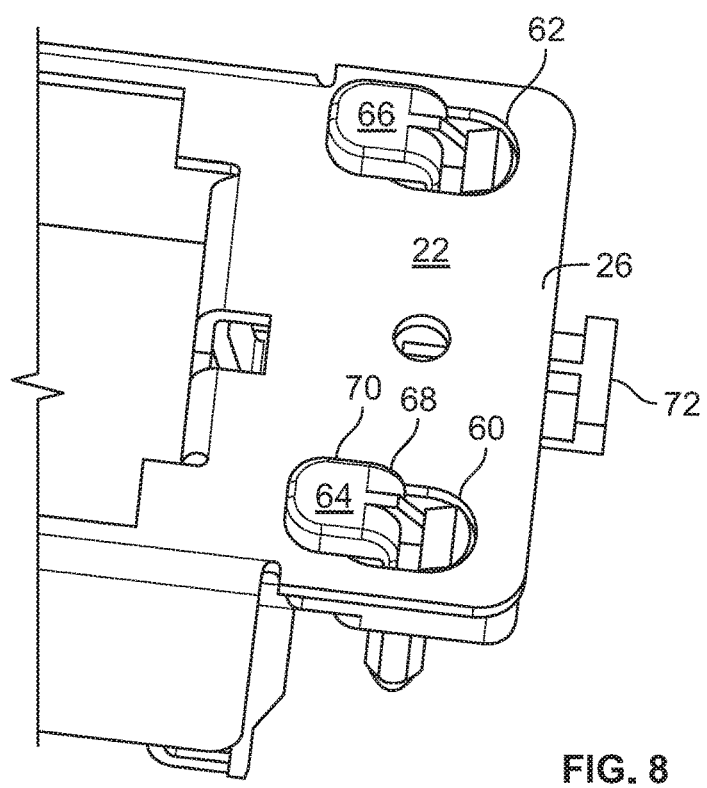
FIG. 8 is a front isometric view of the mounting clip and panel of FIG. 1 in an engaged position.
Figure 9:
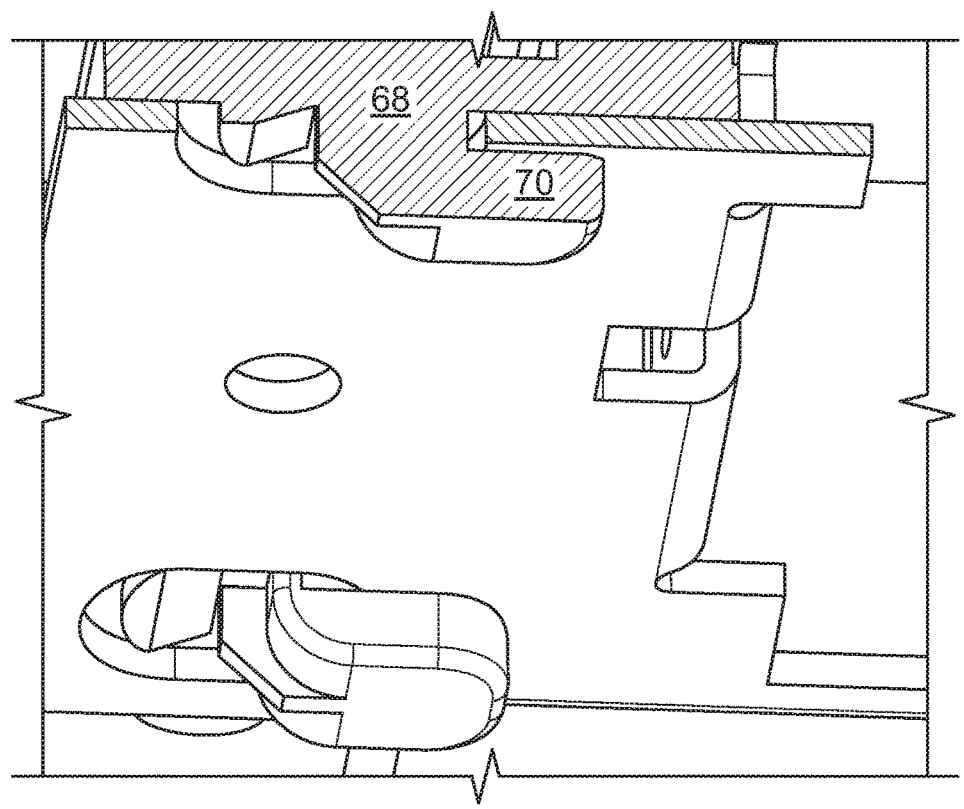
FIG. 9 is a partial cross-sectional isometric view of the mounting clip and panel of FIG. 1 in an engaged position.
Figure 10:
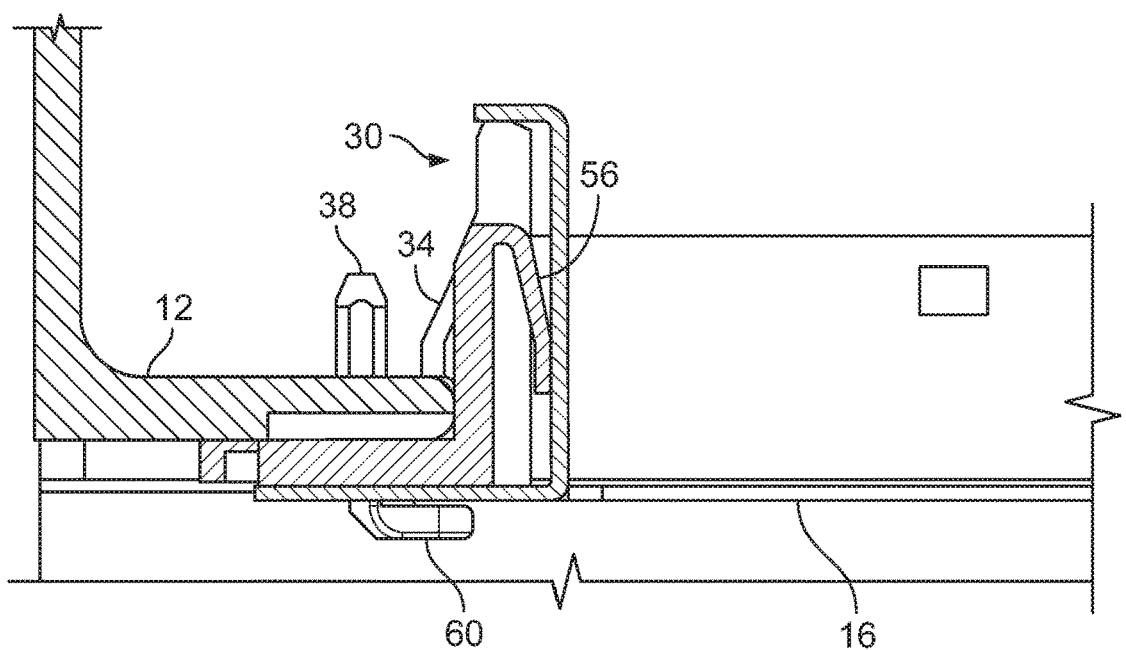
FIG. 10 is a top view of the mounting clip and panel assembly mounted to the rack in a first position.
Figure 11:
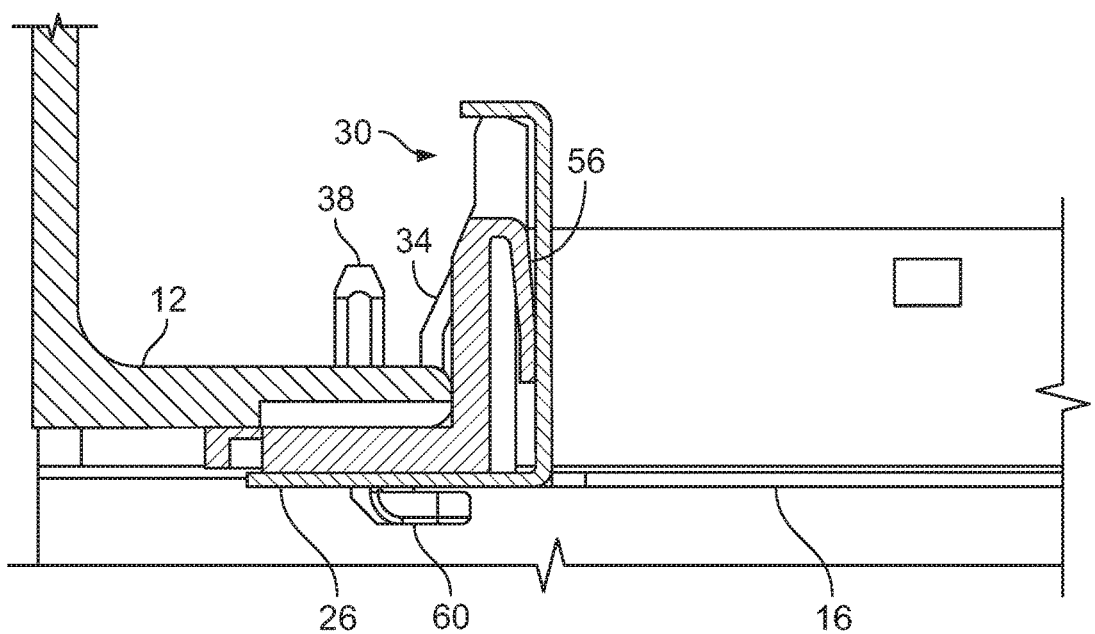
FIG. 11 is a top view of the mounting clip and panel assembly mounted to the rack in a first position.
Figure 12:
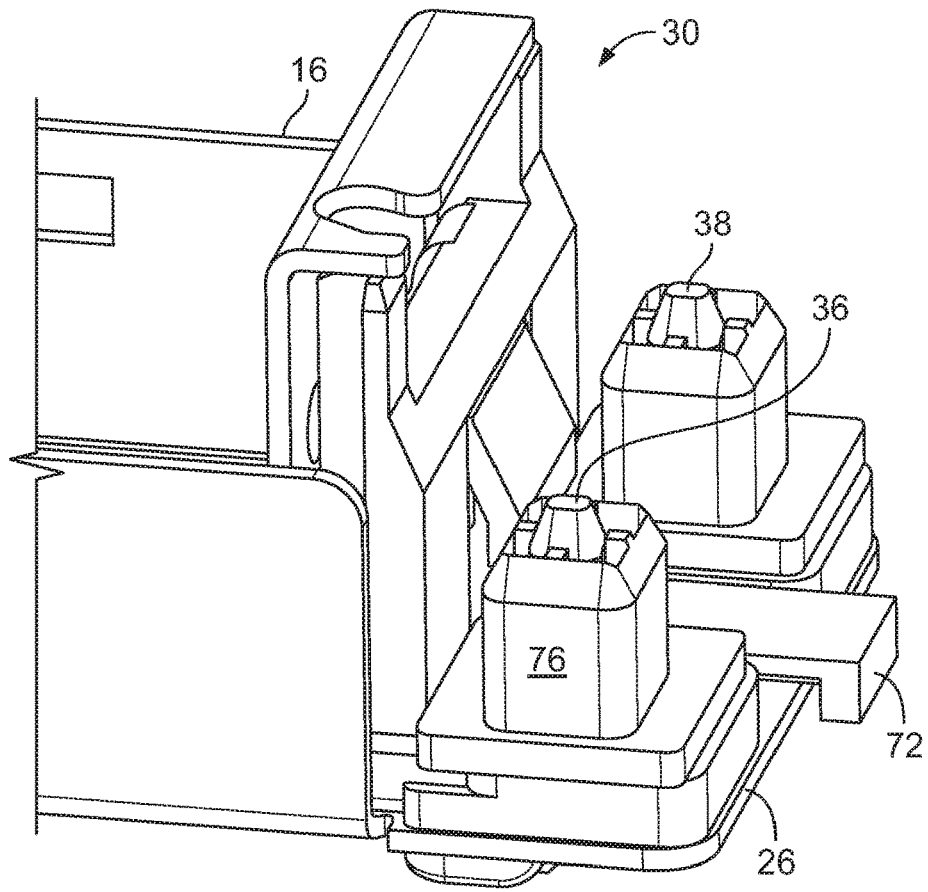
FIG. 12 is a rear isometric view of the mounting clip with converter inserts engaged with the panel.
Figure 13:
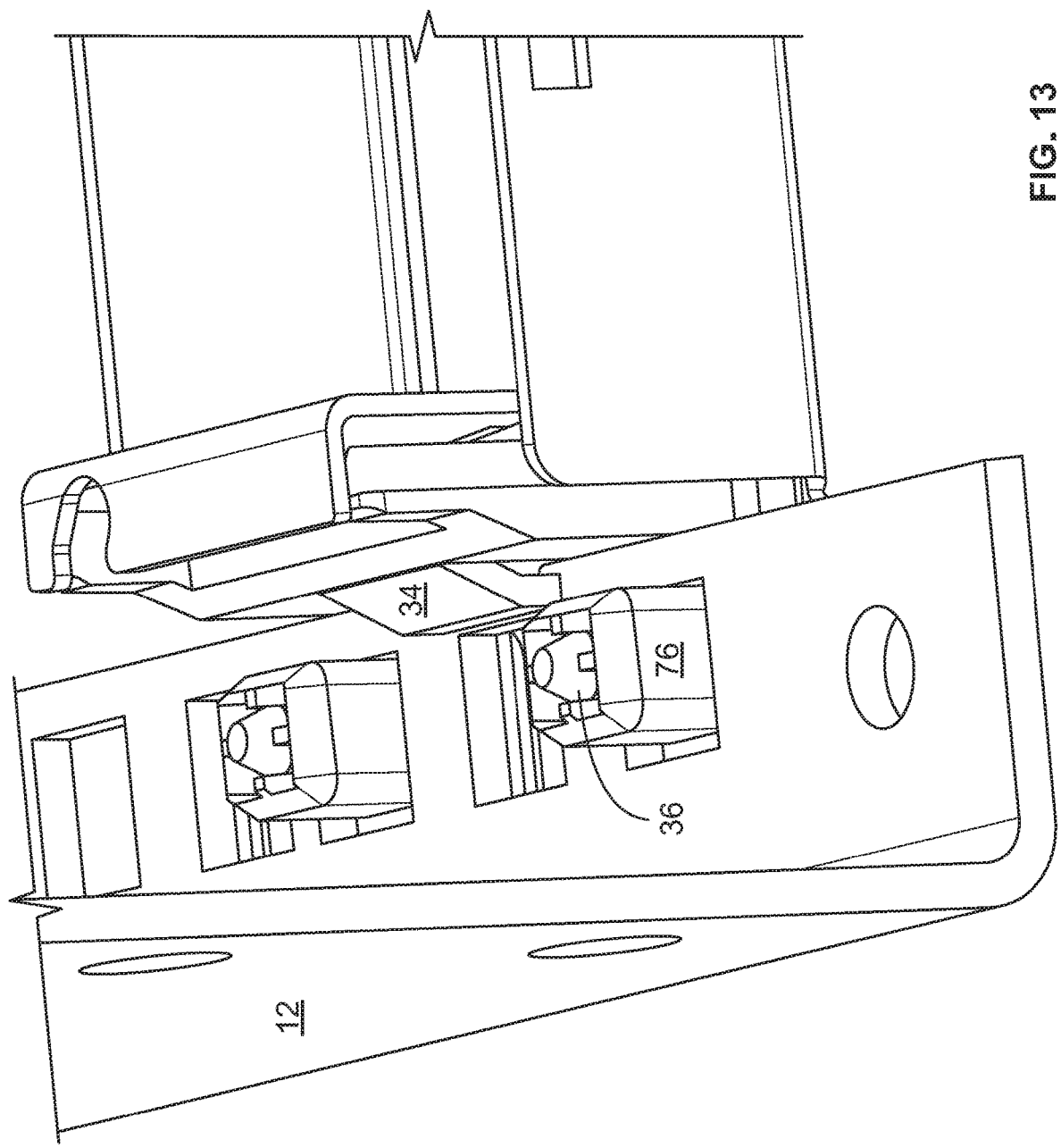
FIG. 13 is a rear isometric view of the mounting clip with converter inserts engaged with the panel and the rail.

Referring to FIGS. 1-13, an embodiment of the telecommunications panel assembly of the present disclosure is described in further detail. In the depicted embodiment, the telecommunications panel assembly is adapted to be mounted to a telecommunications rack without requiring the use of tools (e.g., wrenches, screwdrivers, etc.). In the depicted embodiment, the panel can be secured to the rack without the need of fasteners such as screws and bolts. In the depicted embodiment, the panel of the present disclosure is configured to be easily mounted securely to the rack by hand.

In the depicted embodiment, the telecommunications panel assembly is configured to be mounted to a telecommunications rack 10. In the depicted embodiment, the rack 10 includes a first vertical rail 12 and a second vertical rail 14. In the depicted embodiment, the first and second vertical rails 12, 14 are in the same plane and parallel to each other. In the depicted embodiment, the first and second vertical rails 12, 14 define a vertical column of rail openings. It should be appreciated that many alternative rack configurations are possible.

In the depicted embodiment, the panel assembly includes a panel 16. The panel 16 includes a first end 18 and a second end 20. The first and second ends 18, 20 are separated by a length L of the panel. The length L of the panel extends along a first dimension. In the depicted embodiment, the panel 16 also includes a height H that extends along a second dimension that is perpendicular with respect to the first dimension. In the depicted embodiment, the first dimension of the panel (the length L) is horizontally orientated when the panel 16 is mounted to the telecommunications rack 10. In the depicted embodiment, the panel 16 includes a front surface 22 and a back surface 24. It should be appreciated that many alternative panel configurations are possible.

In the depicted embodiment, the panel 16 includes mounting flanges 26, 28 at the first and second ends 18, 20. In the depicted embodiment, the mounting flanges 26, 28 have opposite front and back sides, which are defined by the front and back surfaces 22, 24 of the panel 16. In the depicted embodiment, the mounting flanges 26, 28 each define panel mounting openings 60, 62 that are adapted to align with the rail openings 40, 42 when the panel 16 is mounted to the telecommunications rack 10. In the depicted embodiment, the panel mounting openings 60, 62 are elongated along the first dimension. It should be appreciated that many alternative panel flange configurations are possible.

In the depicted embodiment, the panel assembly includes mounting clips 30, 32 that mount to the back sides of the mounting flanges 26, 28. In the depicted embodiment, the mounting clips 30, 32 are identical and interchangeable. Therefore, for simplicity, only one of the mounting clips 30, 32 will be described in further detail herein. It should be appreciated that in alternative embodiments the mounting clips 30, 32 need not be identical and need not be interchangeable.

In the depicted embodiment, the mounting clip 30 is configured to slide into engagement with the mounting flange 26. In the depicted embodiment, the mounting clip 30 slides into engagement with the mounting flange 26 generally along the first dimension. In particular, the mounting clip 30 of the depicted embodiment includes retention tabs 64, 66 that fit within the panel mounting openings 60, 62 and allow the mounting clips 30, 32 to slide along the first dimension relative to the panel 16. When the retention tabs 64, 66 are slid into engagement with the mounting openings 60, 62, the retention tabs 64, 66 limit the movement of the mounting clip 30 in the forward and rearward direction while simultaneously allowing side-to-side motion in the first dimension. It should be appreciated that many alternative configurations are possible.

In the depicted embodiment, the retention tabs 64, 66 have identical constructions; therefore, only one of the tabs 64, 66 will be described further herein. In the depicted embodiment, retention tab 64 includes a first portion 68 that extends forwardly from the front face 46 of the front leg 44 (i.e., forwardly from the main body of the mounting clip 30). The retention tab 64 includes a second portion 70 that extends laterally from the first portion 68 in a direction towards the center of the panel 16 (i.e., towards a central reference plane that bisects the panel 16 that is perpendicular with respect to the first direction). It should be appreciated that many alternative tab configurations are possible.

In the depicted embodiment, the mounting clip 30 is a molded plastic part. The mounting clip 30 includes an L-shaped main body. The L-shaped main body includes a front leg 44 having a front face 46 and a rear face 48. The L-shaped main body includes a rear leg 50 that projects rearwardly from the front leg 44. The rear leg 50 has a first side 52 that faces laterally toward the front leg 44 and a second side 54 that faces laterally away from the front leg 44.

In the depicted embodiment, the mounting clip 30 includes a flexible latch 34 that engages the first and second rails 12, 14 to secure the panel 16 to the telecommunications rack 10. In the depicted embodiment, the flexible latch 34 is located at the first side 52 of the rear leg 50 and has a base end 58 integral with the rear leg 50. In the depicted embodiment, the latch 34 is a flexible cantilever latch. It should be appreciated that many alternative configurations are possible for releasably retaining the panel 16 to the rack 10.

In the depicted embodiment, the mounting clip 30 includes a stabilization spring 56 that engages the panel 16 to bias the mounting clips 30, 32 away from one another along the first dimension. In the depicted embodiment, the stabilization spring 56 is located at the second side 54 of the rear leg 50. In the depicted embodiment, the stabilization spring 56 has a base end 58 that is integral with the rear leg 50. In the depicted embodiment, the stabilization spring 56 is formed by a flexible cantilever element having a base end 58 integral with the main body of the mounting clip 30. It should be appreciated that many alternative configurations are possible for automatically taking up the slack between the panel 16 to the rack 10.

In the depicted embodiment, the mounting clip 30 includes rearwardly projecting mounting projections 36, 38. The mounting projections 36, 38 are adapted to fit within the rail openings 40, 42 when the panel 16 is mounted to the telecommunications rack 10. In the depicted embodiment, the mounting projections 36, 38 project rearwardly from the rear face 48 of the front leg 44. It should be appreciated that many alternative configurations of the mount projections are possible.

In the depicted embodiment, the mounting projections 36, 38 have a first transverse cross-sectional profile. The mounting clip 30 is configured to include converter inserts 76 that mount over the mounting projections 36, 38 to provide second transverse cross-sectional profiles that are larger than the first transverse cross-sectional profiles. In the depicted embodiment, the first transverse cross-sectional profiles are compatible with rail openings 40, 42 that are round and the second transverse cross-sectional profiles are compatible with rail openings 40, 42 that are square. In the depicted embodiment, the first transverse cross-sectional profile is round and the second transverse cross-sectional profile is square. It should be appreciated that many other cross-sectional profiles are possible. It should also be appreciated that cross-sectional profiles that are compatible with round rail openings do not necessarily need to be round and cross-sectional profiles that are compatible with square rail openings do not necessarily need to be square. For example, a shape with more than five sides could be from a cross-sectional profile that is compatible with round rail openings. It should also be appreciated that many alternative configurations of the converter inserts are possible.

In the depicted embodiment, the mounting clip 30 includes a release button 72. In the depicted embodiment, the release button 72 is coupled to the flexible latch 34. In the depicted embodiment, the release button 72 is configured such that it is pressed to flex the flexible latch 34 to release the panel 16 from the rack 10. In the depicted embodiment, the release button 72 extends along the first dimension outwardly beyond the mounting flange 26. The release buttons 72 on opposing mounting clips 30, 32 are moveable along the first dimension towards each other to move the flexible latches 34 to a released position. In the depicted embodiment, the release button 72 extends from the flexible latch 34 through a slot 74 defined in the front leg 44. When the release button 72 on the mounting clips 30, 32 on either side of the rack 10 are pressed simultaneously in a direction towards each other (i.e., towards the center of the panel 16), the panel 16 is released from the telecommunications rack 10. It should be appreciated that many alternative configurations for easy release of the panel 16 from the rack 10 are possible.

In the depicted embodiment, the mounting clip 30 is allowed to float laterally in the first dimension relative to the panel 16 while still being secured to the panel 16. In the depicted embodiment, each of the mounting clips 30, 32 have a range of sliding movement along the first dimension relative to the panel 16 that is at least 1.5 millimeters. The lateral float allows the mounting projections 36, 38 to align with the rail openings 40, 42 while taking into account assembly and manufacturing tolerance of the panel 16 and rack 10. The disclosed configuration with the stabilization spring 56 also results in a snug fit, thereby minimizing rattle and vibrations between the panel 16 and the rack 10. The stabilization spring 56 takes up the slack in the lateral direction (first dimension). It should be appreciated that many alternative configurations are possible.

According to one embodiment of the present disclosure, a component is provided that is adapted for attaching a telecommunications panel 16 to a first telecommunications rack 10. The first telecommunications rack 10 includes first rail openings 40, 42 having a first shape and size (e.g., round). The component is also adapted for attaching the telecommunications panel 16 to a second telecommunications rack 10 including second rail openings 40, 42 having a second shape and size (e.g., square). In the depicted embodiment, the component includes a clip 30 adapted to mount to a backside of a mounting flange 26 of the telecommunications panel 16.

The clip 30 includes mounting projections 36, 38 sized to be received within the first rail openings 40, 42 (e.g., round), thereby making the telecommunications panel 16 compatible with the first telecommunications rack 10 and converter pieces 76 sized to be received within the second openings 40, 42 (e.g., square). The converter piece 76 is configured to mount over the mounting projections 36, 38, thereby making the telecommunications panel 16 compatible with the second telecommunications rack 10.

The present disclosure provides a component adapted for attaching a telecommunications panel 16 to a telecommunications rack 10. In the depicted embodiment, the telecommunications rack 10 includes rail openings 40, 42. The component includes a clip 30 adapted to slideably mount to a back side of a mounting flange 26 of the telecommunications panel 16. The clip 30 includes mounting projections 36, 38 configured to be received within the rail openings 40, 42.

The present disclosure also provides a component for attaching a telecommunications panel 16 to a telecommunications rack 10. In one embodiment, the component includes a mounting clip 30 including a molded plastic part having an L-shaped main body. The L-shaped main body includes a front leg 44 having a front face 46 and a rear face 48. The L-shaped main body includes a rear leg 50 that projects rearwardly from the front leg 44. The rear leg 50 has a first side 52 that faces in a first lateral direction toward the front leg 44 and a second side 54 that faces in an opposite second lateral direction away from the front leg 44. The component includes a flexible cantilever latch 34 located at the second side 54 of the rear leg 50. The flexible cantilever latch 34 has a base end 58 integral with the rear leg 50. In the depicted embodiment, a stabilization cantilever spring 56 is located at the first side 52 of the rear leg 50 and has a base end 58 integral with the rear leg 50. In the depicted embodiment, mounting projections 36, 38 project rearwardly from the rear face 48 of the front leg 44. Retention tabs 64, 66 are provided at the front face 46 of the front leg 44. The retention tabs 64, 66 include first portions 68 that project forwardly from the front face 46 of the front leg 44 and second portions 70 that project away from the first portions 68 in the second lateral direction.

While the toolless mounting features have been shown incorporated into clips 30, 32, in other examples, such features can be integrated directly (e.g., unitary or integral) into the flanges 26, 28 of a panel 16 to allow the panel 16 to be mounted to a rack 10 without tools.

Figure 14:
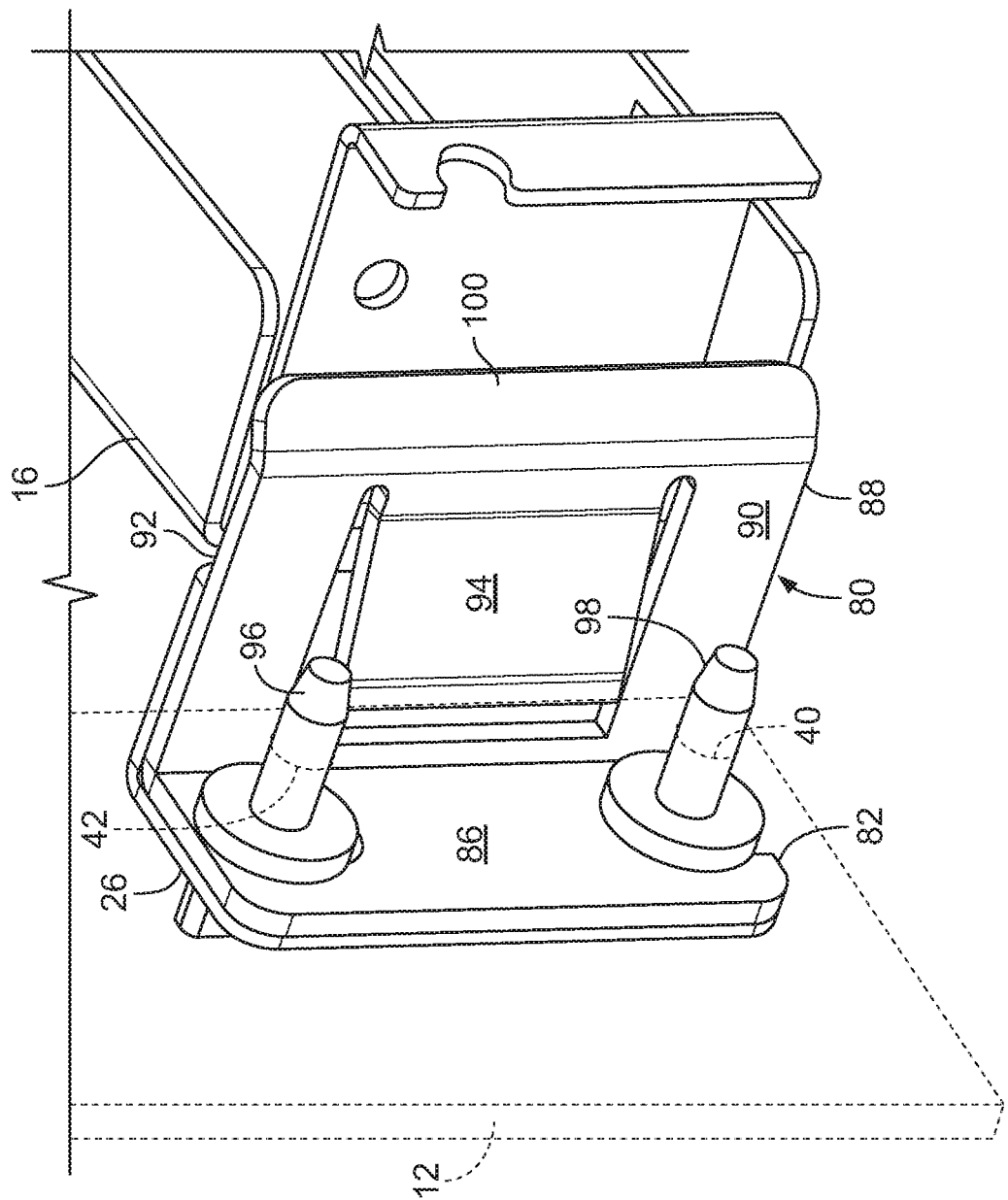
FIG. 14 is a rear isometric view of an alternative embodiment of a mounting clip of the present disclosure engaged with the panel with the rack shown in phantom lines.
Figure 15:
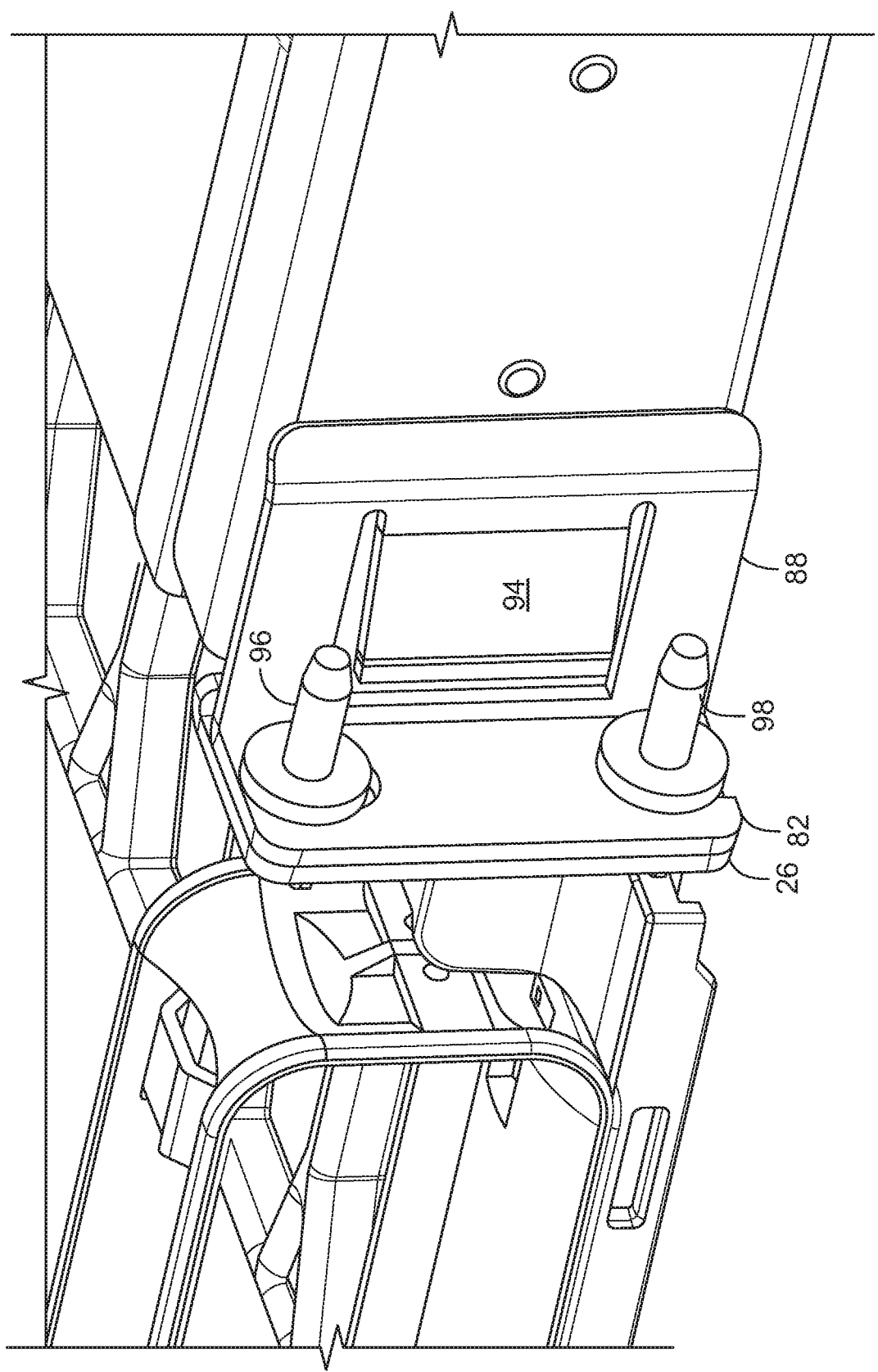
FIG. 15-17 is a rear isometric view of the mounting clip of FIG. 14 engaged with different telecommunication components.
Figure 16:
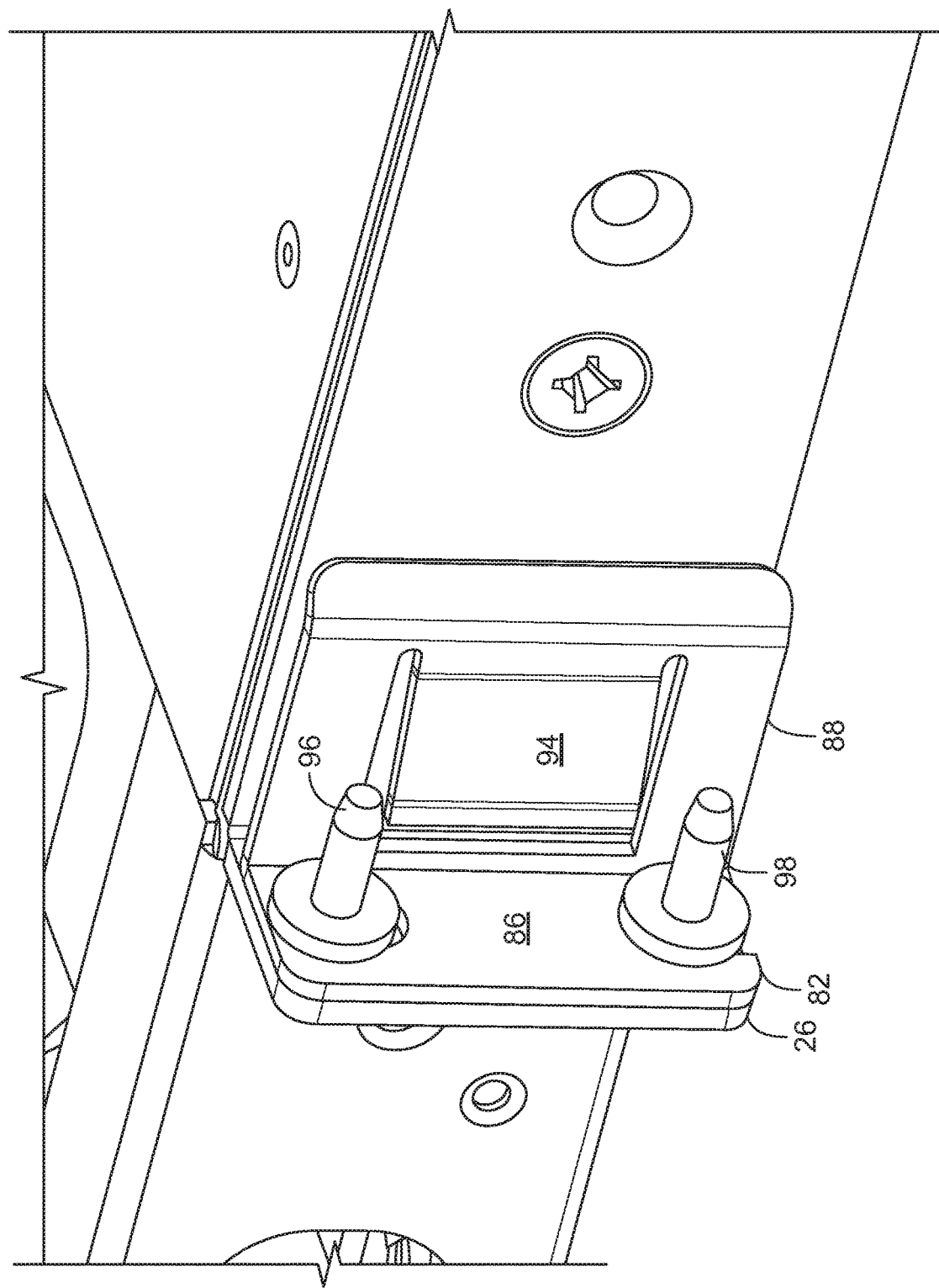
Figure 17:
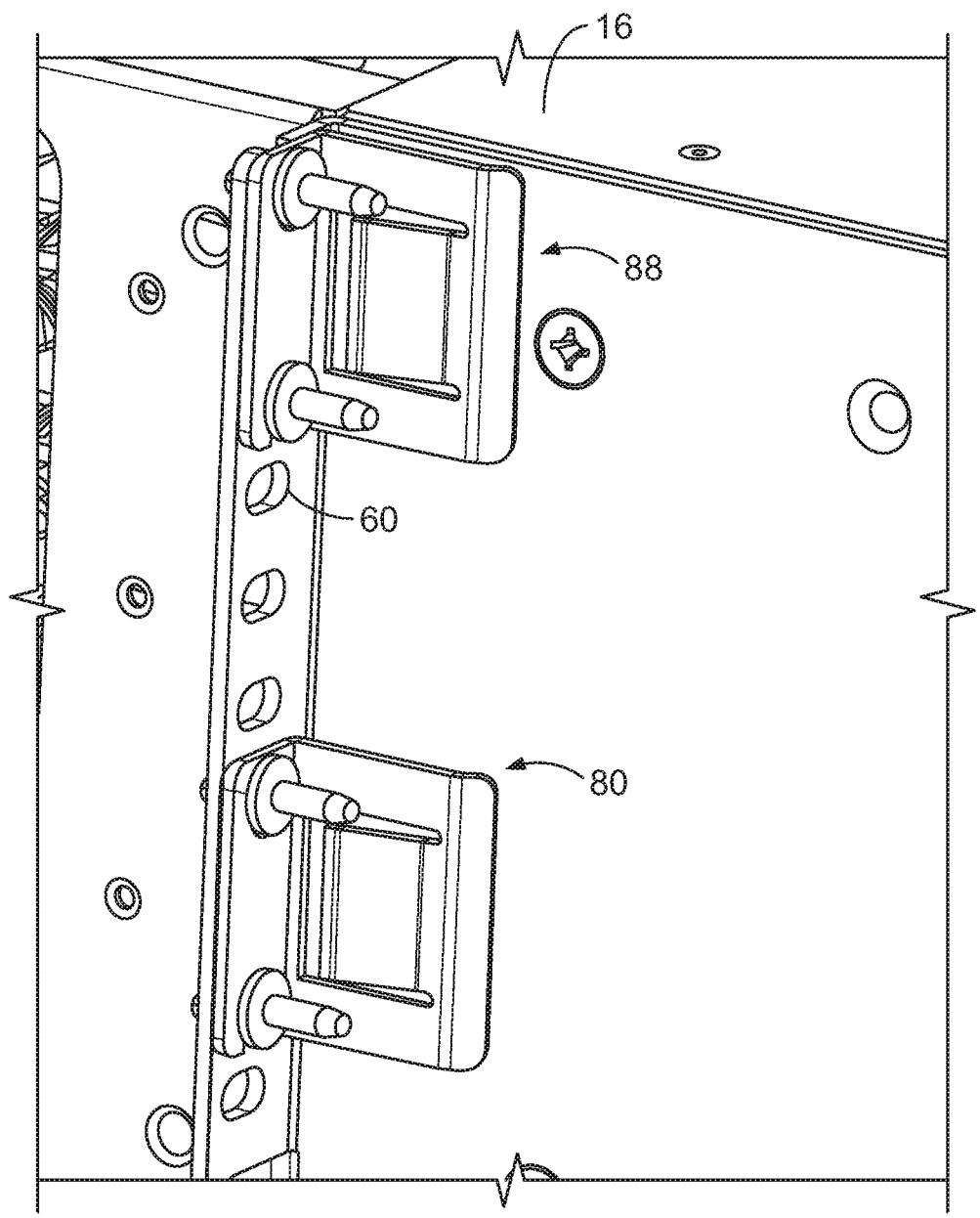
Figure 18:
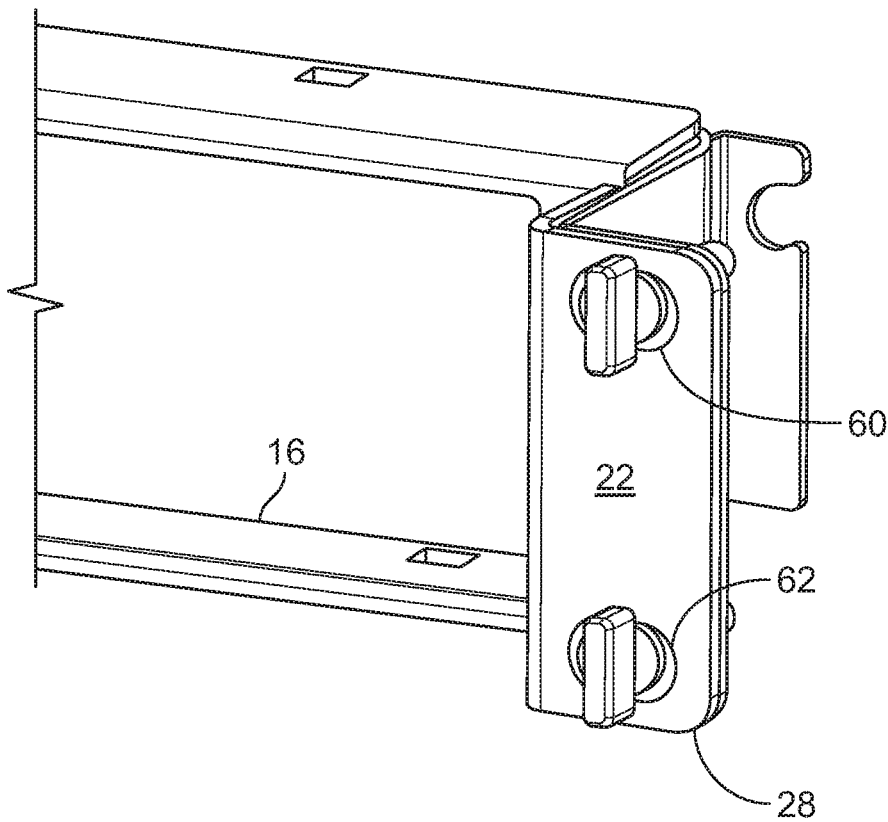
FIG. 18 is a front view of the mounting clip of FIG. 14 secured to a panel.
Figure 19:
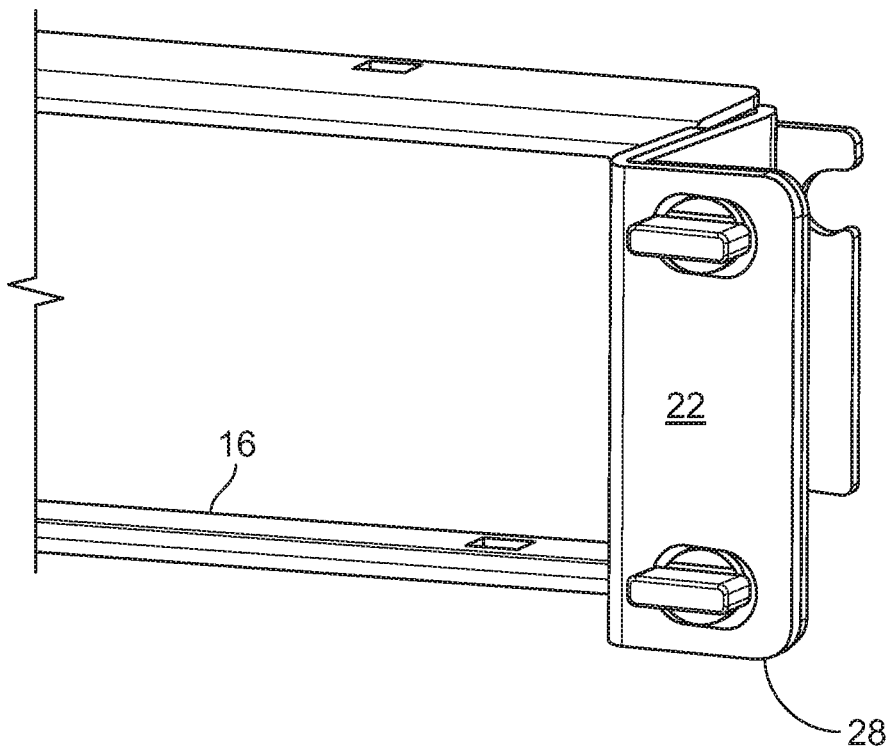
FIG. 19 is a front view of the mounting clip of FIG. 14 unsecured from a panel.
Figure 20:
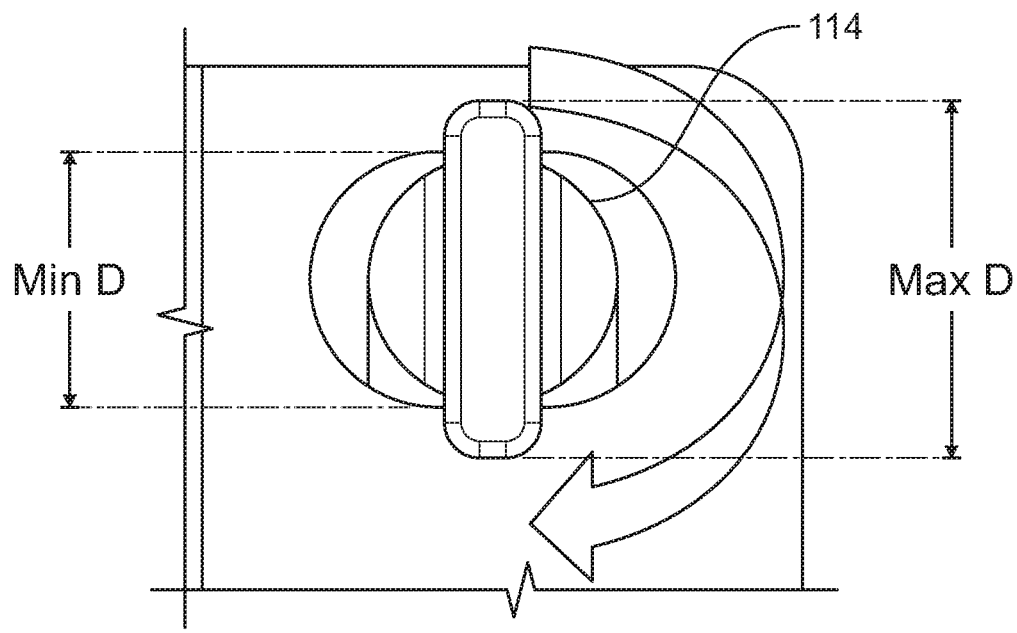
FIG. 20 is an enlarged view of a portion of FIG. 18.
Figure 21:
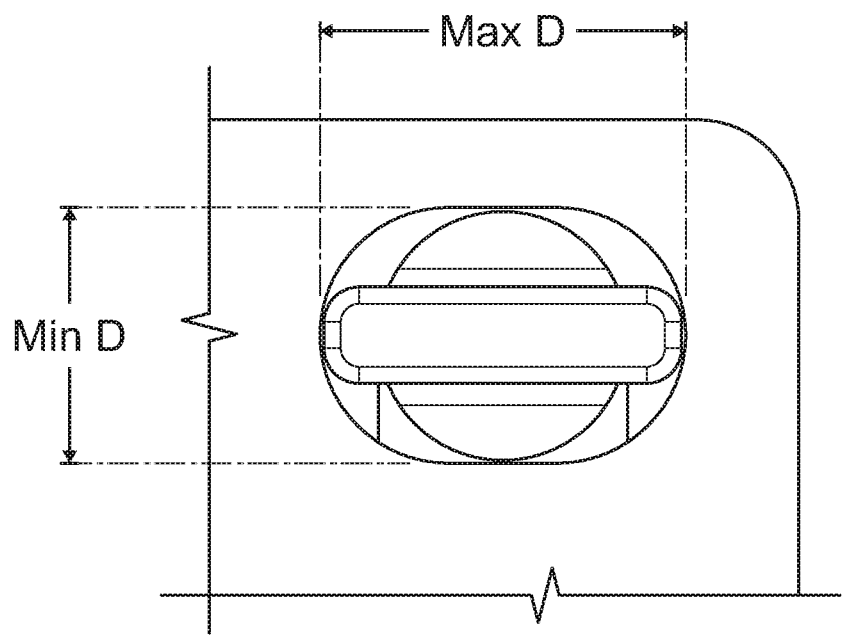
FIG. 21 is an enlarged view of a portion of FIG. 19.
Figure 22:
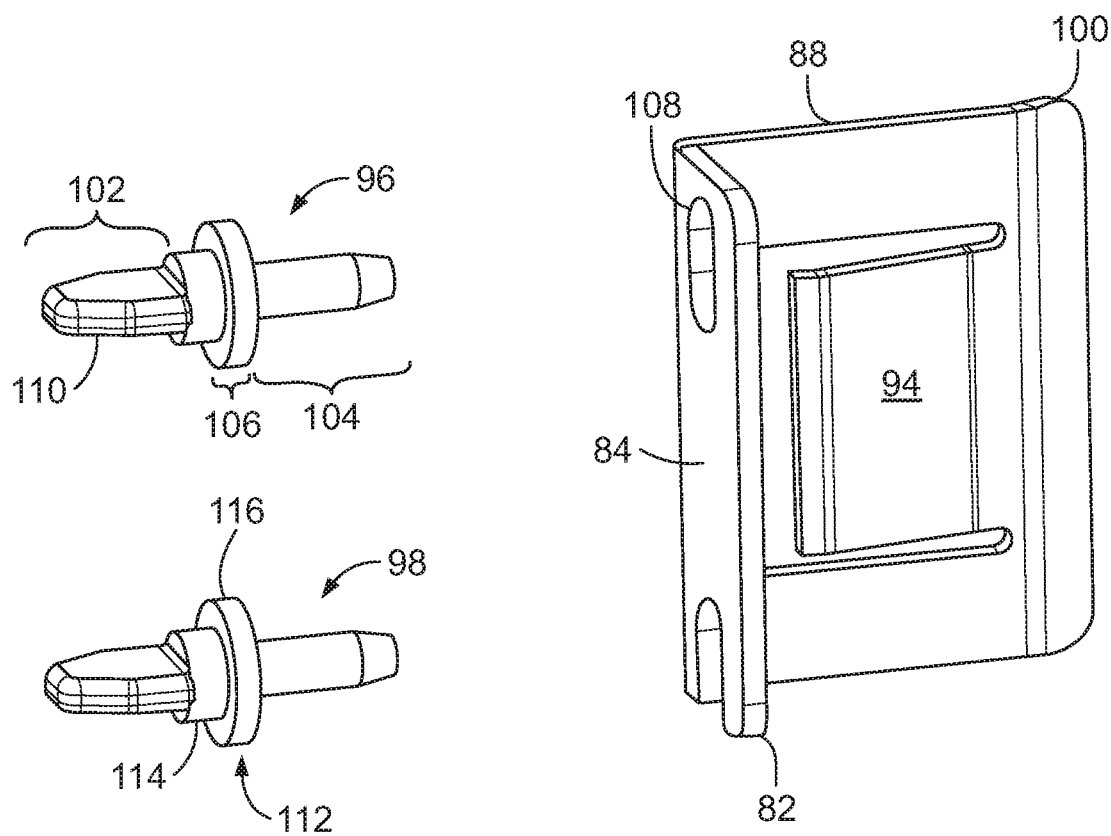
FIG. 22 is an exploded front isometric view of the mounting clip of FIG. 14.
Figure 23:
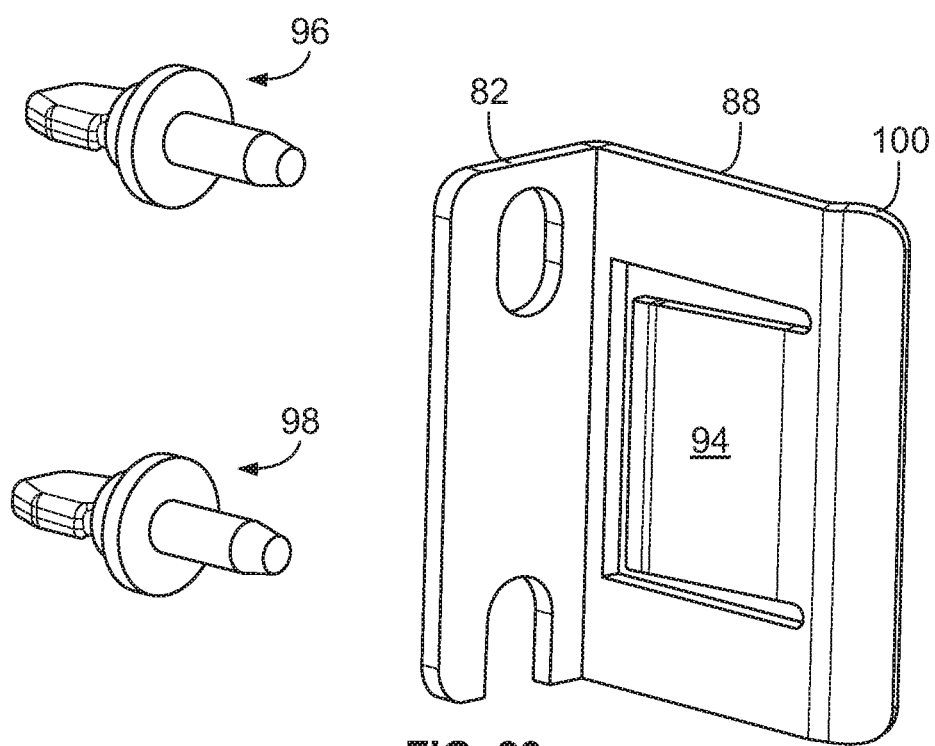
FIG. 23 is an exploded rear isometric view of the mounting clip of FIG. 14.

Referring to FIGS. 14-23, an alternative embodiment of the clip 30 is described in detail. In the depicted alternative embodiment, the mounting clip 80 mounts to the back sides of the mounting flanges 26, 28 of the panel 16. In the depicted embodiment, the mounting clips 80, 82 are identical and interchangeable. Therefore, for simplicity, only one of the mounting clips 80, 82 will be described in further detail herein. It should be appreciated that in alternative embodiments the mounting clips 80, 82 need not be identical and need not be interchangeable.

In the depicted embodiment, the mounting clip 80 is configured to abut the front surface 22 of the mounting flange 28 of the panel 16. In the depicted embodiment, the mounting clip 80 is a molded plastic part. The mounting clip 80 includes an L-shaped main body. The L-shaped main body includes a front leg 82 having a front face 84 and a rear face 86. The L-shaped main body includes a rear leg 88 that projects rearwardly from the front leg 82. The rear leg 88 has a first side 90 that faces laterally toward the front leg 82 and a second side 92 that faces laterally away from the front leg 82.

In the depicted embodiment, the mounting clip 80 includes a flexible latch 94 that engages the first and second rails 12, 14 to secure the panel 16 to the telecommunications rack 10. In the depicted embodiment, the flexible latch 94 is located at the first side 90 of the rear leg 88 and has a base end that is integral with the rear leg 88. In the depicted embodiment, the latch 94 is a flexible cantilever latch. It should be appreciated that many alternative configurations are possible for releasably retaining the panel 16 to the rack 10.

In the depicted embodiment, the mounting clip 80 includes rearwardly projecting mounting projections 96, 98. The mounting projections 96, 98 are adapted to fit within the rail openings 40, 42 when the panel 16 is mounted to the telecommunications rack 10. In the depicted embodiment, the mounting projections 96, 98 project rearwardly from the rear face 86 of the front leg 82. It should be appreciated that many alternative configurations of the mount projections are possible.

In the depicted embodiment, the mount projections 96, 98 share the same construction and are interchangeable. Therefore, only one of the mount projections 96, 98 will be described in further detail herein. In the depicted embodiment, the mount projection 96 includes a first end portion 102, a second end portion 104, and a mid-portion 106. In the depicted embodiment, the first end portion 102 of the rearwardly projecting mounting projection 96 is configured to extend through an aperture 108 in the mounting clip 80 and panel mounting openings 60, 62 in the panel 16.

In the depicted embodiment, the first end portion 102 of the rearwardly projecting mounting projection 96 is configured to secure the mounting clip 80 against the panel 16. In the depicted embodiment, the first end portion 102 includes a tab 110 that has a maximum dimension MaxD that is wider than a minimum opening dimension MinD of panel mounting openings 60, 62 in the panel 16. In use, the tab 110 can extend through the panel mounting openings 60, 62 in the panel 16 when in a first orientation, and when rotated about a central axis to a second orientation (e.g., 90 degrees relative to the first orientation) the tab 110 can no longer pass through the panel mounting openings 60, 62.

In the depicted embodiment, the mid-portion 106 of the rearwardly extending projection 96 includes a stop 112 that is configured to seat against a rearward facing surface 86 of the clip 80. In the depicted embodiment, the stop 112 includes a locating portion 114 and a collar portion 116. The locating portion 114 is configured to extend through the clip 80 and at least partially into the panel mounting openings 60, 62 in the panel 16. The collar portion 116 is configured to abut the rearward surface 86 of the clip 80. In the depicted embodiment, the clip 80 is mounted to the mounting flanges 26, 28 by aligning the clip 80 with the panel 16, and then extending the first end portion 102 of the mounting projection 96 through the aperture 108 in the clip 80 and the panel mounting openings 60, 62 in the panel 16 until the collar portion 116 of the stop 112 abuts the rear face 86 of the front leg 82 of the clip 80. Finally, rotating the locking tab 110 that extends through the rail openings 40, 42 to secure the clip 80 against the rail 12. See FIGS. 20-21.

In the depicted embodiment, the mounting clip 80 is allowed to float laterally in the first dimension relative to the panel 16 while still being secured to the panel 16. In the depicted embodiment, each of the mounting clips 80, 82 have a range of sliding movement along the first dimension relative to the panel 16 that is at least 1.5 millimeters. The lateral float allows the mounting projections 96, 98 to align with the rail openings 40, 42 while taking into account assembly and manufacturing tolerance of the panel 16 and rack 10.

The disclosed configuration with the stabilization spring 100 also results in a snug fit, thereby minimizing rattle and vibrations between the panel 16 and the rack 10. The stabilization spring 100 takes up the slack in the lateral direction (first dimension). In the depicted embodiment, the stabilization spring 100 is a bend in the rear leg 88 at its distal end in a direction away from the front leg 82. This bend biases the clip 80 in a direction away from the center of the panel 16. It should be appreciated that many alternative configurations are possible.

Figure 24:
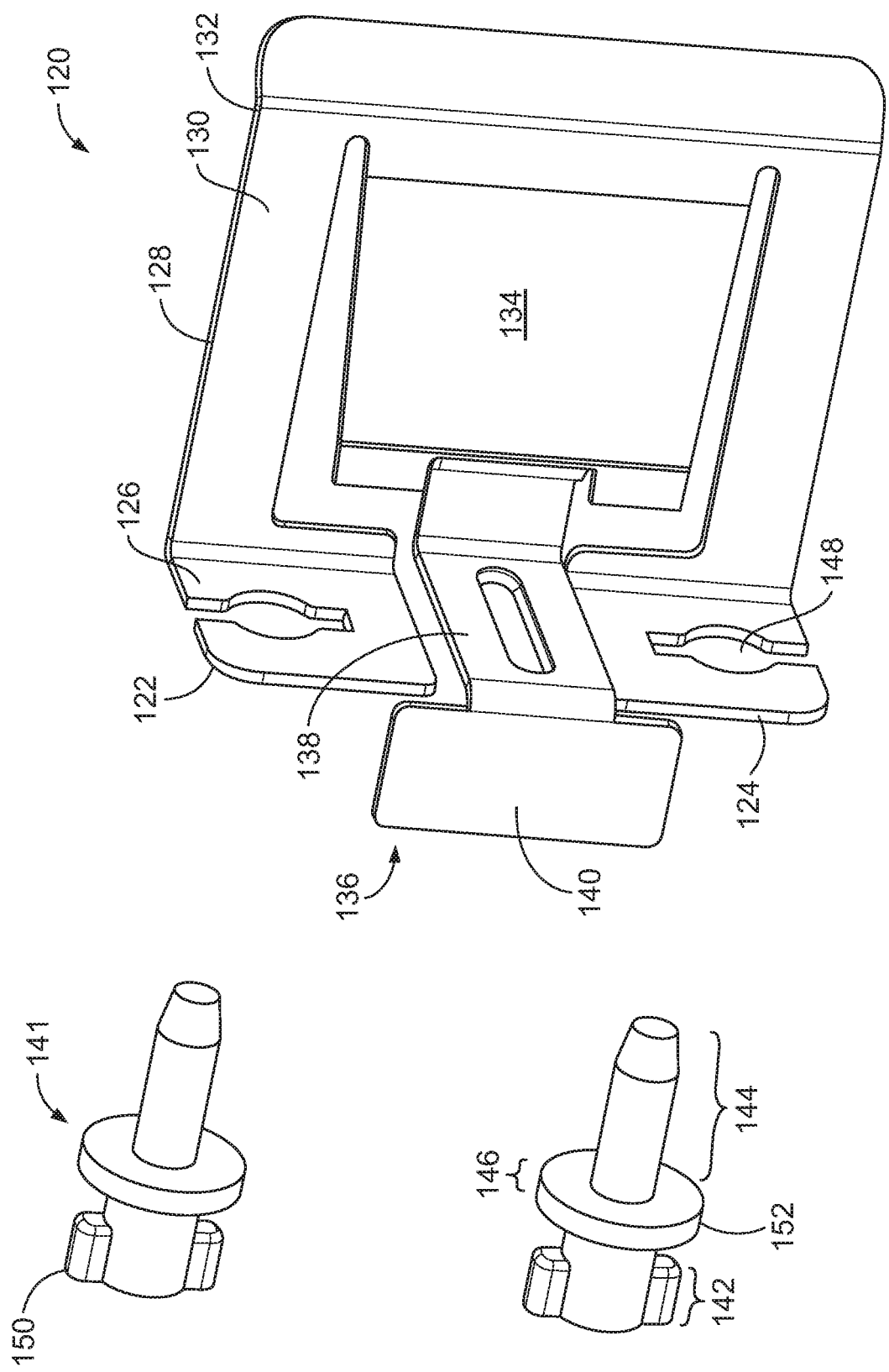
FIG. 24 is an exploded rear isometric view of an alternative embodiment of a mounting clip of the present disclosure.
Figure 25:
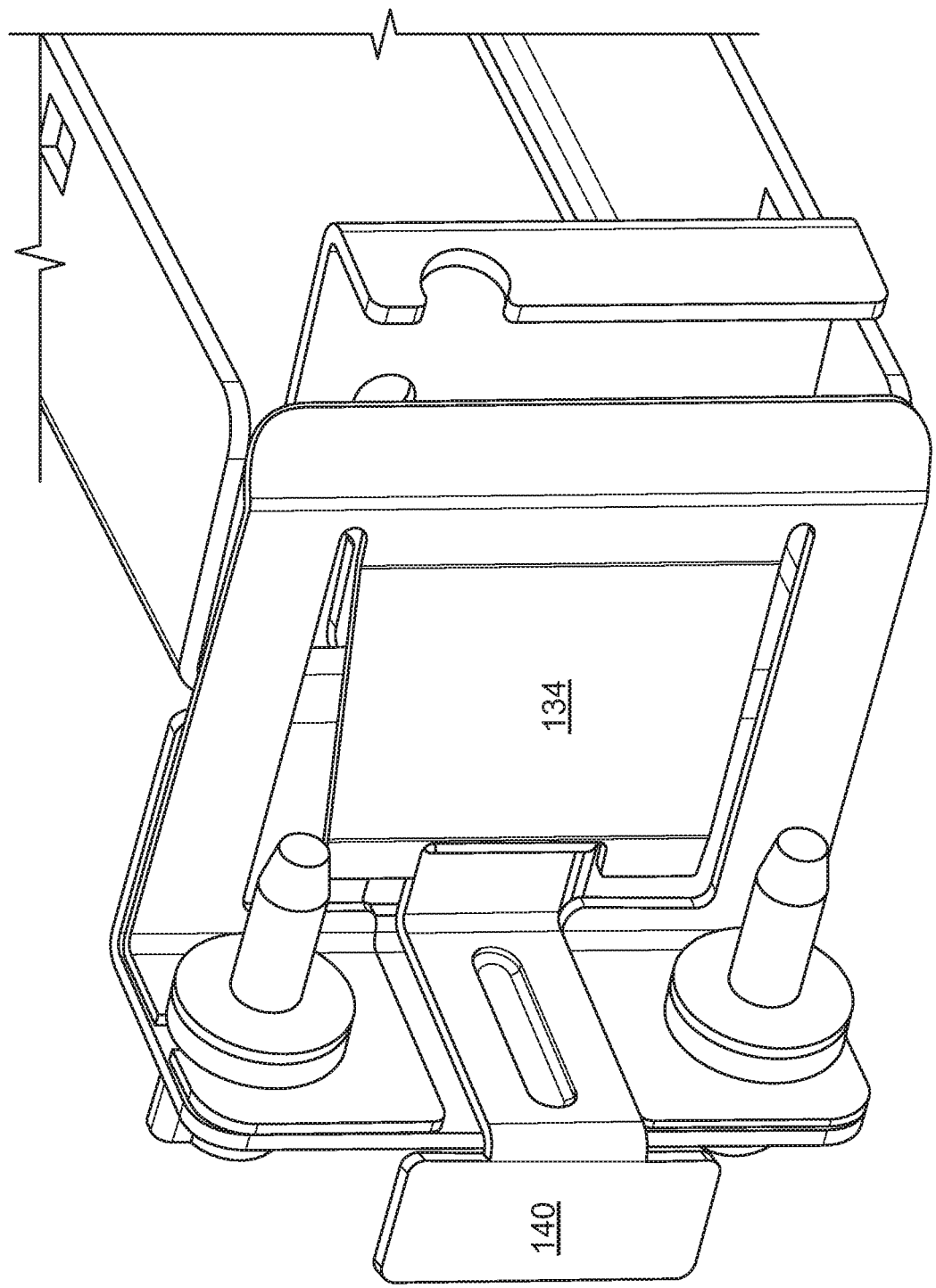
FIG. 25 is a rear isometric view of the mounting clip secured to a panel.
Figure 28:
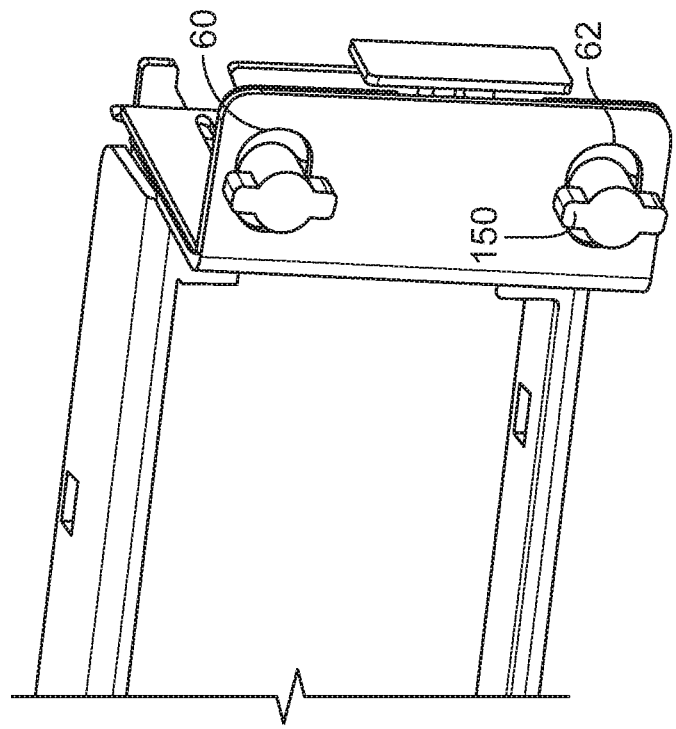
FIG. 28 is a front view of the mounting clip secured to the panel of FIG. 27.
Figure 27:
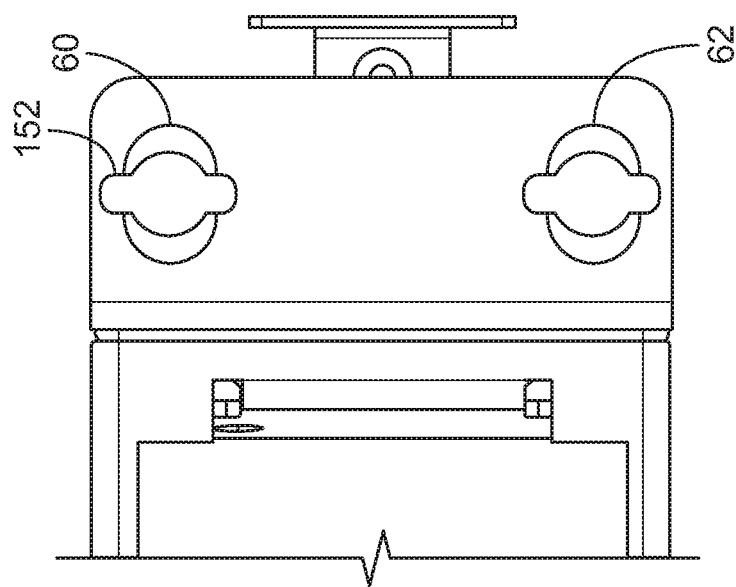
FIG. 27 is a front isometric view of the mounting clip secured to another panel.

Referring to FIGS. 24-28, another embodiment of the mounting clip is described in further detail. In the depicted embodiment, mounting clip 120 includes a number of similar structural features to mounting clips previously disclosed herein. The unique features of mounting clip 120 will be the focus of the present description.

In the depicted embodiment, mounting clip 120 includes an L-shaped main body. The L-shaped main body includes a front leg 122 having a front face 124 and a rear face 126. The L-shaped main body includes a rear leg 128 that projects rearwardly from the front leg 122. The rear leg 128 has a first side 130 that faces laterally toward the front leg 122 and a second side 132 that faces laterally away from the front leg 122.

In the depicted embodiment, the mounting clip 120 includes a flexible latch 134 that engages the first and second rails 12, 14 to secure the panel 16 to the telecommunications rack 10. In the depicted embodiment, the flexible latch 134 is located at the first side 130 of the rear leg 128 and has a base end that is integral with the rear leg 128. In the depicted embodiment, the latch 134 is a flexible cantilever latch. It should be appreciated that many alternative configurations are possible for releasably retaining the panel 16 to the rack 10.

In the depicted embodiment, a release mechanism 136 is connected to the distal end of the latch 134. The release mechanism 136 includes a first portion 138 and a second portion 140. The first portion 138 is connected to the distal end of the latch 134 and is in plane with the front leg 122. The second portion 140 is connected to the first portion 138 and extends beyond the front leg 122 and provides a surface that the users can depress with his or her hands to cause the latch 134 to flex and release the rail that the mounting clip 120 is secured thereto (e.g., a release button).

In the depicted embodiment, the mounting clip 120 includes a mount projection 141 that secures the mounting clip 120 to the rails 12, 14. The mount projection 141 includes a first end portion 142, a second end portion 144, and a mid-portion 146. In the depicted embodiment, the first end portion 142 of the rearwardly projecting mounting projection 141 is configured to extend through an aperture 148 in the mounting clip 120 and panel mounting openings 60, 62 in the panel 16.

In the depicted embodiment, the first end portion 142 of the rearwardly projecting mounting projection 141 is configured to secure the mounting clip 120 against the panel 16. In the depicted embodiment, the first end portion 124 includes a tab 150 that has a maximum dimension MaxD that is wider than a minimum opening dimension MinD of panel mounting openings 60, 62 in the panel 16. In use, the tab 150 can extend through the panel mounting openings 60, 62 in the panel 16 when in a first orientation, and when rotated about a central axis to a second orientation (e.g., 90 degrees relative to the first orientation) the tab 150 can no longer pass through the panel mounting openings 60, 62.

In the depicted embodiment, the mid-portion 146 of the rearwardly extending projection 141 includes a stop 152 that is configured to seat against a rearward facing surface 126 of the clip 120. In the depicted embodiment, the stop 152 includes a locating portion 114 and a collar portion 116. In the depicted embodiment, the clip 120 is mounted to the mounting flanges 26, 28 by aligning the clip 120 with the panel 16, and then extending the first end portion 142 of the mounting projection 141 through the aperture 108 in the clip 80 and the panel mounting openings 60, 62 in the panel 16 until the stop 152 abuts the rear face 126 of the front leg 122 of the clip 120. Finally, rotating the locking tab 150 that extends through the rail openings 40, 42 to secure the clip 80 against the rail 12. See FIGS. 27 and 28.

In the depicted embodiment, the mounting clip 120 is allowed to float laterally in the first dimension relative to the panel 16 while still being secured to the panel 16. In the depicted embodiment, each of the mounting clips 120 have a range of sliding movement along the first dimension relative to the panel 16 that is at least 1.5 millimeters. The lateral float allows the mounting projections 141 to align with the rail openings 40, 42 while taking into account assembly and manufacturing tolerance of the panel 16 and rack 10.

Example Aspects of the Present Disclosure

Aspect 1: Aspect 1 relates to a component for attaching a telecommunications panel to different telecommunications racks, the component comprising: a mounting clip adapted to mount to a telecommunications panel, the clip including mounting projections sized to be received within the first rail openings of a first telecommunications rack; and converter pieces configured to mount over the mounting projections thereby making the telecommunications panel compatible with the second rail openings of a second telecommunications rack.

Aspect 2: Aspect 2 includes any of Aspects 1, 18 or 19, and wherein the mounting clip is mounted to a back side of a mounting flange of the telecommunications panel.

Aspect 3: Aspect 3 includes any of Aspects 1 and 2, and wherein the telecommunications rack includes first and second vertical rails that each define a vertical column of rail openings.

Aspect 4: Aspect 4 includes any of Aspects 1-3, and wherein the panel having first and second ends separated by a length of the panel, the length of the panel extending along a first dimension, the panel also including a height that extends along a second dimension that is perpendicular with respect to the first dimension, the first dimension of the panel being horizontal when the panel is mounted to the telecommunications rack, the panel including a front and a back, the panel including mounting flanges at the first and second ends, the mounting flanges having opposite front and back sides.

Aspect 5: Aspect 5 includes any of Aspects 1-4, and wherein the mounting clip mounts to the back sides of the mounting flanges, the mounting clips including flexible latches that engage the first and second rails to secure the panel to the telecommunications rack, the mounting clips being slideably mounted to the mounting flanges such that the mounting clips are slideable relative to the mounting flanges along the first dimension, the mounting clips including rearwardly projecting mounting projections adapted to fit within the rail openings when the panel is mounted to the telecommunications rack.

Aspect 6: Aspect 6 includes any of Aspects 1-5, and wherein the mounting clips include stabilization springs that engage the panel to bias the mounting clips away from one another along the first dimension.

Aspect 7: Aspect 7 includes any of Aspects 1-6, and wherein the stabilization springs are formed by flexible cantilever elements having base ends integral with main bodies of the mounting clips.

Aspect 8: Aspect 8 includes any of Aspects 1-7, and wherein the mounting projections have first transverse cross-sectional profiles, and wherein the telecommunications panel assembly includes converter inserts that mount over the mounting projections to provide second transverse cross-sectional profiles that are larger than the first transverse cross-sectional profiles.

Aspect 9: Aspect 9 includes any of Aspects 1-8, and wherein first transverse cross-sectional profiles are compatible with rail openings that are round and the second transverse cross-sectional profiles are compatible with rail openings that are square.

Aspect 10: Aspect 10 includes any of Aspects 1-9, and wherein the second transverse cross-sectional profiles are generally square shaped, and the first transverse cross-sectional profiles are generally round shaped or have more than five sides.

Aspect 11: Aspect 11 includes any of Aspects 1-10, and wherein the mounting flanges define panel mounting openings adapted to align with the rail openings when the panel is mounted to the telecommunications rack, and wherein the mounting clips include retention tabs that fit within the panel mounting openings and allow the mounting clips to slide along the first dimension relative to the panel.

Aspect 12: Aspect 12 includes any of Aspects 1-11, and wherein the mounting clips each have a range of sliding movement along the first dimension relative to the panel that is at least 1.5 millimeters.

Aspect 13: Aspect 13 includes any of Aspects 1-12, and wherein the panel mounting openings are elongated along the first dimension, wherein the panel is bisected by a central reference plane that is perpendicular with respect to the first dimension, wherein the retention tabs include first portions that extend forwardly from main bodies of the mounting clips, and second portions that extend laterally from the first portions along the first dimension toward the central reference plane.

Aspect 14: Aspect 14 includes any of Aspects 1-13, and wherein the mounting clips include release buttons coupled to the flexible latches, wherein the release buttons are pressed to flex the flexible latches toward each other to release the panel from the telecommunications rack.

Aspect 15: Aspect 15 includes any of Aspects 1-14, and wherein the release buttons extend along the first dimension outwardly beyond the mounting flanges, and wherein the release buttons are moveable along the first dimension towards each other to move the flexible latches to a released position.

Aspect 16: Aspect 16 includes any of Aspects 1-15, and wherein the mounting clips are molded plastic parts and each include an L-shaped main body, wherein the L-shaped main body includes a front leg having a front face and a rear face, wherein the L-shaped main body includes a rear leg that projects rearwardly from the front leg, the rear leg having a first side that faces laterally toward the front leg and a second side that faces laterally away from the front leg, wherein the flexible latch is located at the first side of the rear leg and has a base end integral with the rear leg, wherein the stabilization spring is located at the second side of the rear leg and has a base end integral with the rear leg, wherein the mounting projections project rearwardly from the rear face of the front leg, and wherein the retention tabs project forwardly from the front face of the front leg.

Aspect 17: Aspect 17 includes any of Aspects 1-16, and wherein the release button extends from the flexible latch through a slot defined in the front leg.

Aspect 18: Aspect 18 relates to a component for attaching a telecommunications panel to a telecommunications rack, the component comprising: a mounting clip adapted to slideably mount to a telecommunications panel, the clip including mounting projections configured to be received within the rail openings.

Aspect 19: Aspect 19 relates to a component for attaching a telecommunications panel to a telecommunications rack, the component comprising: a mounting clip configured to interface between the panel and the rack, the mounting clip including being configured to take up slack between the panel and the rack.

Aspect 20: Aspect 20 relates to a telecommunications panel configured to mount to a telecommunications rack: the panel includes end flanges that include mounting projections sized to be received within the first rail openings of a first telecommunications rack.

Aspect 21: Aspect 21 includes Aspect 20, and further includes converter pieces configured to mount over the mounting projections thereby making the telecommunications panel compatible with the second rail openings of a second telecommunications rack.

Aspect 22: Aspect 22 includes any of Aspects 18-21, and wherein the projections are located on a back side of a mounting flange of the telecommunications panel.

Aspect 23: Aspect 23 includes any of Aspects 21 or 22, and wherein the telecommunications rack includes first and second vertical rails that each define a vertical column of rail openings.

Aspect 24: Aspect 24 includes any of Aspects 21-23, and wherein the panel having first and second ends separated by a length of the panel, the length of the panel extending along a first dimension, the panel also including a height that extends along a second dimension that is perpendicular with respect to the first dimension, the first dimension of the panel being horizontal when the panel is mounted to the telecommunications rack, the panel including a front and a back, the panel including mounting flanges at the first and second ends, the mounting flanges having opposite front and back sides.

Aspect 25: Aspect 25 includes any of Aspects 21-24, and further includes flexible latches that engage the first and second rails to secure the panel to the telecommunications rack.

Aspect 26: Aspect 26 includes any of Aspects 21-25, and wherein the mounting projections have first transverse cross-sectional profiles, and wherein the telecommunications panel assembly includes converter inserts that mount over the mounting projections to provide second transverse cross-sectional profiles that are larger than the first transverse cross-sectional profiles.

Aspect 27: Aspect 27 includes any of Aspects 21-26, and wherein first transverse cross-sectional profiles are compatible with rail openings that are round and the second transverse cross-sectional profiles are compatible with rail openings that are square.

Aspect 28: Aspect 28 includes any of Aspects 21-27, and wherein the second transverse cross-sectional profiles are generally square shaped, and the first transverse cross-sectional profiles are generally round shaped or have more than five sides.

Aspect 29: Aspect 29 includes any of Aspects 21-27, and wherein the panel includes release buttons coupled to the flexible latches, wherein the release buttons are pressed to flex the flexible latches toward each other to release the panel from the telecommunications rack.

Aspect 30: Aspect 30 includes any of Aspects 21-29, and wherein the release buttons extend along the first dimension outwardly beyond the mounting flanges, and wherein the release buttons are moveable along the first dimension towards each other to move the flexible latches to a released position.

Aspect 31: Aspect 31 includes any of Aspects 21-30, and wherein the release button extends from the flexible latch through a slot defined in the front leg.

Aspect 32: Aspect 32 relates to a component that facilitates the connection between a telecommunications panel and a rack that includes rearwardly projecting mounting projections that are configured to removably secure the mounting clip to the panel.

Aspect 33: Aspect 33 includes Aspect 32, and wherein each rearwardly projecting mounting projection includes a first end portion, a second end portion, and a mid-portion, wherein the first end portion of the rearwardly projecting mounting projection is configured to extend through an aperture in the mounting clip and an aperture in the panel, wherein the first end portion of the rearwardly projecting mounting projection is configured to secure the mounting clip against the panel.

Aspect 34: Aspect 34 includes any of Aspects 32 or 33, and wherein the first end portion of the rearwardly extending projection includes a tab that has a maximum width dimension that is wider than a minimum opening dimension of an aperture in the panel, wherein the tab can extend through the aperture in the panel when in a first orientation, and when rotated about a central axis to a second orientation the tab cannot pass through the aperture in the panel; wherein the mid-portion of the rearwardly extending projection includes a stop that is configured to seat against a rearward facing surface of the clip.

Aspect 35: Aspect 35 includes any of Aspects 32-34, and wherein the stop includes a locating portion and a collar portion, the locating portion is configured to extend through the clip and at least partially into the aperture in the panel, and the collar portion is configured to abut the rearward surface of the clip.

Aspect 36: Aspect 36 includes any of Aspects 32-35, and wherein the clip is mounted to the mounting flanges by rotating the locking tabs that extend through the panel openings.

Aspect 37: Aspect 37 relates to a component for attaching a telecommunications panel to a telecommunications rack, the component comprising: a mounting clip including a molded plastic part having an L-shaped main body, including a front leg having a front face and a rear face and a rear leg that projects rearwardly from the front leg having a first side that faces in a first lateral direction toward the front leg and a second side that faces in an opposite second lateral direction away from the front leg, wherein mounting projections project rearwardly from the rear face of the front leg, the mounting projection including a first end portion, a second end portion, and a mid-portion; wherein the first end portion of the mounting projection projects through an aperture in the front leg, the first end portion includes a locking tab; wherein the mid-portion of the mounting projection includes a collar portion that abuts the rear face of the front leg.

Aspect 38: Aspect 38 includes Aspect 37, and wherein a flexible cantilever latch is located at the first side of the rear leg and has a base end integral with the rear leg.

Aspect 39: Aspect 39 includes any of Aspects 37 or 38, and wherein the rear leg includes a bend at a distal end in a direction away from the front leg.

Terms such as "top," "bottom," "horizontal," "vertical," "proximal," "distal" and related and similar terms used throughout this disclosure are used for ease of illustration in relating components/areas of the tools of the present disclosure to one another and do not limit how the tools may be used in practice.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A telecommunications panel assembly adapted to be mounted to a telecommunications rack without requiring the use of a tool, the telecommunications rack including first and second vertical rails that each define a vertical column of rail openings, the telecommunications panel assembly comprising:
 a panel having first and second ends separated by a length of the panel, the length of the panel extending along a first dimension, the panel also including a height that extends along a second dimension that is perpendicular with respect to the first dimension, the first dimension of the panel being horizontal when the panel is mounted to the telecommunications rack, the panel including a front and a back, the panel including mounting flanges at the first and second ends, the mounting flanges having opposite front and back sides; and mounting features provided at the mounting flanges, the mounting features including flexible latches that engage the first and second rails to secure the panel to the telecommunications rack, the mounting features including rearwardly projecting mounting projections adapted to fit within the rail openings when the panel is mounted to the telecommunications rack;

wherein at least some of the mounting features are integrated into mounting clips that mount to the back sides of the mounting flanges, and wherein the mounting clips are slidably mounted to the mounting flanges such that the mounting clips are slideable relative to the mounting flanges along the first dimension, and wherein the mounting clips include stabilization springs that engage the panel to bias the mounting clips away from one another along the first dimension.

2. The telecommunications panel assembly of claim 1, wherein the stabilization springs are formed by flexible cantilever elements having base ends integral with main bodies of the mounting clips.

3. The telecommunications panel assembly of claim 1, wherein the mounting projections have first transverse cross-sectional profiles, and wherein the telecommunications panel assembly includes converter inserts that mount over the mounting projections to provide second transverse cross-sectional profiles that are larger than the first transverse cross-sectional profiles.

4. The telecommunications panel assembly of claim 3, wherein the first transverse cross-sectional profiles are compatible with rail openings that are round and the second transverse cross-sectional profiles are compatible with rail openings that are square.

5. The telecommunications panel assembly of claim 4, wherein the second transverse cross-sectional profiles are generally square shaped, and the first transverse cross-sectional profiles are generally round shaped or have more than five sides.

6. The telecommunications panel assembly of claim 1, wherein the mounting flanges define panel mounting openings adapted to align with the rail openings when the panel is mounted to the telecommunications rack, and wherein the mounting clips include retention tabs that fit within the panel mounting openings and allow the mounting clips to slide along the first dimension relative to the panel.

7. The telecommunications panel assembly of claim 6, wherein the mounting clips each have a range of sliding movement along the first dimension relative to the panel that is at least 1.5 millimeters.

8. The telecommunications panel assembly of claim 6, wherein the panel mounting openings are elongated along the first dimension, wherein the panel is bisected by a central reference plane that is perpendicular with respect to the first dimension, wherein the retention tabs include first portions that extend forwardly from main bodies of the mounting clips, and second portions that extend laterally from the first portions along the first dimension toward the central reference plane.

9. The telecommunications panel assembly of claim 1, wherein the mounting features include release buttons coupled to the flexible latches, wherein the release buttons are pressed to flex the flexible latches toward each other to release the panel from the telecommunications rack.

10. The telecommunications panel assembly of claim 9, wherein the release buttons extend along the first dimension outwardly beyond the mounting flanges, and wherein the release buttons are moveable along the first dimension towards each other to move the flexible latches to a released position.

11. The telecommunications panel assembly of claim 10, wherein the mounting clips are molded plastic parts and each include an L-shaped main body, wherein the L-shaped main body includes a front leg having a front face and a rear face, wherein the L-shaped main body includes a rear leg that projects rearwardly from the front leg, the rear leg having a first side that faces laterally toward the front leg and a second side that faces laterally away from the front leg, wherein the flexible latch is located at the first side of the rear leg and has a base end integral with the rear leg, wherein the stabilization spring is located at the second side of the rear leg and has a base end integral with the rear leg, wherein the mounting projections project rearwardly from the rear face of the front leg, and wherein retention tabs project forwardly from the front face of the front leg.

12. The telecommunications panel assembly of claim 11, wherein the release button extends from the flexible latch through a slot defined in the front leg.

13. A component for attaching a telecommunications panel to a telecommunications rack, the component comprising:

a mounting clip including a molded plastic part having an L-shaped main body, wherein the L-shaped main body includes a front leg having a front face and a rear face, wherein the L-shaped main body includes a rear leg that projects rearwardly from the front leg, the rear leg having a first side that faces in a first lateral direction toward the front leg and a second side that faces in an opposite second lateral direction away from the front leg, wherein a flexible cantilever latch is located at the first side of the rear leg and has a base end integral with the rear leg, wherein a stabilization cantilever spring is located at the second side of the rear leg and has a base end integral with the rear leg, wherein mounting projections project rearwardly from the rear face of the front leg, wherein retention tabs are provided at the front face of the front leg, the retention tabs including first portions that project forwardly from the front face of the front leg and second portions that project away from the first portions in the second lateral direction.

14. A telecommunications panel assembly adapted to be mounted to a telecommunications rack without requiring the use of a tool, the telecommunications rack including first and second vertical rails that each define a vertical column of rail openings, the telecommunications panel assembly comprising:

a panel having first and second ends separated by a length of the panel, the length of the panel extending along a first dimension, the panel also including a height that extends along a second dimension that is perpendicular with respect to the first dimension, the first dimension of the panel being horizontal when the panel is mounted to the telecommunications rack, the panel including a front and a back, the panel including mounting flanges at the first and second ends, the mounting flanges having opposite front and back sides; and mounting features provided at the mounting flanges, the mounting features including flexible latches that engage the first and second rails to secure the panel to the telecommunications rack, the mounting features including rearwardly projecting mounting projections adapted to fit within the rail openings when the panel is mounted to the telecommunications rack;

wherein the mounting features include release buttons coupled to the flexible latches, wherein the release buttons are pressed to flex the flexible latches toward each other to release the panel from the telecommunications rack, wherein the release buttons extend along the first dimension outwardly beyond the mounting flanges, and wherein the release buttons are moveable along the first dimension towards each other to move the flexible latches to a released position and, wherein at least some of the mounting features are integrated into mounting clips, wherein the mounting clips are molded plastic parts and each include an L-shaped main body, wherein the L-shaped main body includes a front leg having a front face and a rear face, wherein the L-shaped main body includes a rear leg that projects rearwardly from the front leg, the rear leg having a first side that faces laterally toward the front leg and a second side that faces laterally away from the front leg, wherein the flexible latch is located at the first side of the rear leg and has a base end integral with the rear leg, wherein a stabilization spring is located at the second side of the rear leg and has a base end integral with the rear leg, wherein the mounting projections project rearwardly from the rear face of the front leg, and wherein retention tabs project forwardly from the front face of the front leg.

15. A telecommunications panel assembly of claim 14, wherein the release button extends from the flexible latch through a slot defined in the front leg.

16. A telecommunications panel assembly adapted to be mounted to a telecommunications rack without requiring the use of a tool, the telecommunications rack including first and second vertical rails that each define a vertical column of rail openings, the telecommunications panel assembly comprising:

a panel having first and second ends separated by a length of the panel, the length of the panel extending along a first dimension, the panel also including a height that extends along a second dimension that is perpendicular with respect to the first dimension, the first dimension of the panel being horizontal when the panel is mounted to the telecommunications rack, the panel including a front and a back, the panel including mounting flanges at the first and second ends, the mounting flanges having opposite front and back sides; and mounting features provided at the mounting flanges, the mounting features including flexible latches that engage the first and second rails to secure the panel to the telecommunications rack, the mounting features including rearwardly projecting mounting projections adapted to fit within the rail openings when the panel is mounted to the telecommunications rack;

wherein at least some of the mounting features are integrated into mounting clips that mount to the back sides of the mounting flanges, wherein the mounting flanges define panel mounting openings adapted to align with the rail openings when the panel is mounted to the telecommunications rack, and wherein the mounting clips include retention tabs that fit within the panel mounting openings and allow the mounting clips to slide along the first dimension relative to the panel, and wherein the panel mounting openings are elongated along the first dimension, wherein the panel is bisected by a central reference plane that is perpendicular with respect to the first dimension, wherein the retention tabs include first portions that extend forwardly from main bodies of the mounting clips, and second portions that extend laterally from the first portions along the first dimension toward the central reference plane.

* * * * *